United States Patent
Park et al.

(10) Patent No.: US 9,209,250 B2
(45) Date of Patent: Dec. 8, 2015

(54) HIGH ELECTRON MOBILITY TRANSISTORS, METHODS OF MANUFACTURING THE SAME, AND ELECTRONIC DEVICES INCLUDING THE SAME

(71) Applicant: Samsung Electronics Co., Ltd., Suwon-Si, Gyeonggi-Do (KR)

(72) Inventors: Young-hwan Park, Seoul (KR); Jai-kwang Shin, Anyang-si (KR); Ki-yeol Park, Suwon-si (KR); Jae-joon Oh, Seongnam-si (KR); Woo-chul Jeon, Daegu (KR); Hyo-ji Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/282,466

(22) Filed: May 20, 2014

(65) Prior Publication Data

US 2015/0048421 A1 Feb. 19, 2015

(30) Foreign Application Priority Data

Aug. 14, 2013 (KR) .................... 10-2013-0096895

(51) Int. Cl.
*H01L 29/778* (2006.01)
*H01L 29/10* (2006.01)
*H01L 29/66* (2006.01)
*H01L 29/20* (2006.01)

(52) U.S. Cl.
CPC ...... *H01L 29/1058* (2013.01); *H01L 29/66462* (2013.01); *H01L 29/7786* (2013.01); *H01L 29/7787* (2013.01); *H01L 29/2003* (2013.01)

(58) Field of Classification Search
CPC .............. H01L 29/778; H01L 29/7786; H01L 29/7787; H01L 29/66462
See application file for complete search history.

(56) References Cited

U.S. PATENT DOCUMENTS

| | | | |
|---|---|---|---|
| 2007/0296060 | A1 | 12/2007 | Tanabe et al. |
| 2008/0203433 | A1 | 8/2008 | Sato |

(Continued)

FOREIGN PATENT DOCUMENTS

| | | |
|---|---|---|
| KR | 20050081174 A | 8/2005 |
| KR | 10-1008272 B1 | 1/2011 |

OTHER PUBLICATIONS

Dong-Joon Kim et al. "Activation of Mg Acceptor in GaN: Mg With Pulsed KrF (248 nm) Excimer Laser Irradiation" phys. stat. sol. (b) 228, No. 2, p. 375-378 (2001).

*Primary Examiner* — Whitney T Moore
*Assistant Examiner* — Scott Stowe
(74) *Attorney, Agent, or Firm* — Harness, Dickey & Pierce

(57) ABSTRACT

Provided are high electron mobility transistors (HEMTs), methods of manufacturing the HEMTs, and electronic devices including the HEMTs. An HEMT may include an impurity containing layer, a partial region of which is selectively activated. The activated region of the impurity containing layer may be used as a depletion forming element. Non-activated regions may be disposed at opposite side of the activated region in the impurity containing layer. A hydrogen content of the activated region may be lower than the hydrogen content of the non-activated region. In another example embodiment, an HEMT may include a depletion forming element that includes a plurality of regions, and properties (e.g., doping concentrations) of the plurality of regions may be changed in a horizontal direction.

21 Claims, 17 Drawing Sheets

(56) References Cited

U.S. PATENT DOCUMENTS

2008/0296618 A1 12/2008 Suh et al.
2012/0211760 A1* 8/2012 Yamada .......................... 257/76
2013/0062666 A1* 3/2013 Imada ........................... 257/194

* cited by examiner

< COMPARATIVE EXAMPLE >

< COMPARATIVE EXAMPLE >

< COMPARATIVE EXAMPLE >

< COMPARATIVE EXAMPLE >

HIGH ELECTRON MOBILITY TRANSISTORS, METHODS OF MANUFACTURING THE SAME, AND ELECTRONIC DEVICES INCLUDING THE SAME

RELATED APPLICATIONS

This application claims priority from Korean Patent Application No. 10-2013-0096895, filed on Aug. 14, 2013, in the Korean Intellectual Property Office, the disclosure of which is incorporated herein in its entirety by reference.

BACKGROUND

1. Field

One or more example embodiments relate to high electron mobility transistors (HEMTs), methods of manufacturing the same, and electronic devices including HEMTs.

2. Description of the Related Art

Various typical electronic apparatuses such as power conversion systems or motor driving systems as well as various industrial facilities require a device for controlling flow of an electric current through ON/OFF switching operations, that is, a power device. In a typical power conversion system, efficiency of the entire system may be dependent upon the efficiency of the power device.

Power devices that are currently commercialized are mostly power metal-oxide-semiconductor field-effect transistors (MOSFETs) or insulated gate bipolar transistors (IGBTs) which are based on silicon (Si). However, it is generally difficult to increase the efficiency of the silicon-based power device due to limitations in physical properties of the silicon and in manufacturing processes. In order to overcome the above limitations among others, research for increasing conversion efficiency by applying group III-V based compound semiconductor to a power device is being conducted. In this regard, high electron mobility transistors (HEMTs) using a heterojunction structure of compound semiconductors have drawn attention. In order to efficiently use an HEMT in various electronic devices, it may be preferable to improve or adjust the characteristics of the HEMT. In particular, it may be desirable to improve or adjust an on-current level, a threshold voltage, and the like of the HEMT. SUMMARY At least one example embodiment includes high electron mobility transistors (HEMTs) having excellent operating characteristics.

One or more example embodiments include HEMTs having a normally-off characteristic and a low on-resistance.

One or more example embodiments include HEMTs having an excellent withstand voltage characteristic.

One or more example embodiments include HEMTs capable of restraining a gate leakage current.

One or more example embodiments include HEMTs capable of adjusting characteristics to be suitable for purposes.

One or more example embodiments include methods of manufacturing the HEMTs.

One or more example embodiments may include electronic devices (for example, a power device among other electronic devices) including the HEMTs.

Additional example embodiments will be set forth in part in the description which follows and, in part, will be apparent from the description, or may be learned by practice of the presented example embodiments.

According to one or more example embodiments, a high electron mobility transistor (HEMT) may include, among other elements: a first semiconductor layer; a second semiconductor layer disposed on the first semiconductor layer, the second semiconductor layer inducing a two-dimensional electron gas (2DEG) in the first semiconductor layer; an impurity containing layer disposed on the second semiconductor layer and containing p-type impurities; a gate disposed on the impurity containing layer; and a source and a drain separated from the gate and electrically connected to at least one of the first semiconductor layer and the second semiconductor layer, wherein the impurity containing layer includes a first region corresponding to the gate and a second region disposed at an opposite side of the first region, the first region includes an impurity region that is activated to generate holes and the second region comprises a non-activated impurity region, and a depletion region is formed by the activated impurity region in a region of the 2DEG corresponding to the activated impurity region.

According to at least one example embodiment, a hydrogen content of the first region of the impurity containing layer may be lower than a hydrogen content of the second region.

According to at least one example embodiment, a work function of the first region of the impurity containing layer may be greater than a work function of the second region.

According to at least one example embodiment, an electric resistance of the second region of the impurity containing layer may be higher than an electric resistance of the first region.

According to at least one example embodiment, the first semiconductor layer may include a gallium nitride-based material.

According to at least one example embodiment, the second semiconductor layer may have a single-layered or multi-layered structure including at least one material selected from nitrides containing at least one of aluminum (Al), gallium (Ga), indium (In), and boron (B).

According to at least one example embodiment, the impurity containing layer may include a group III-V based nitride.

According to at least one example embodiment, the p-type impurities may include, for example, magnesium (Mg).

According to at least one example embodiment, the first region of the impurity containing layer may have a constant doping concentration.

According to at least one example embodiment, the first region of the impurity containing layer may have a doping level that is changed laterally.

According to at least one example embodiment, the first region of the impurity containing layer may have a width that is greater than a width of the gate.

According to at least one example embodiment, the first region and the second region of the impurity containing layer may have the same thickness as each other.

According to at least one example embodiment, the first region of the impurity containing layer may have a thickness that is greater than a thickness of the second region.

According to at least one example embodiment, the HEMT may be a normally-off device.

According to one or more example embodiments, an electronic device, for example, a power device, may include the HEMT.

According to one or more example embodiments, a high electron mobility transistor (HEMT) may include, among other elements: a first semiconductor layer; a second semiconductor layer disposed on the first semiconductor layer, the second semiconductor layer inducing a two-dimensional electron gas (2DEG) in the first semiconductor layer; a gate corresponding to a portion of the second semiconductor layer; a source and a drain separated from the gate and electrically connected to at least one of the first semiconductor layer and the second semiconductor layer; and a depletion forming element disposed between the gate and the second semiconductor layer and configured to form a depletion region in the 2DEG, wherein the depletion forming element may include a plurality of regions, and properties of the plurality of regions may be changed in a horizontal direction.

According to at least one example embodiment, the depletion forming element may include a group III-V based nitride and p-type impurities doped in the group III-V based nitride.

According to at least one example embodiment, the plurality of regions of the depletion forming element may have different doping levels from each other.

According to at least one example embodiment, the depletion forming element may include a first doped region and a second doped region, the second doped region may be closer to the drain than the first doped region is, and the doping level of the second doped region may be lower than the doping level of the first doped region.

According to at least one example embodiment, the depletion forming element may have a width that is the same as or greater than a width of the gate.

According to at least one example embodiment, the HEMT may further include a material layer including non-activated impurities on the second semiconductor layer at opposite sides of the depletion forming element.

According to one or more example embodiments, an electronic device, for example, a power device, may include the HEMT.

According to one or example more embodiments, a method of manufacturing a high electron mobility transistor (HEMT) includes: forming a first semiconductor layer; forming a second semiconductor layer on the first semiconductor layer, wherein the second semiconductor layer induces a two-dimensional electron gas (2DEG) in the first semiconductor layer; forming an impurity containing layer including p-type impurities on the second semiconductor layer; forming an activated region by selectively activating a first region of the impurity containing layer, wherein a region of the 2DEG is depleted by the activated region; forming a gate on the activated region in a state where non-activated region remains in the impurity containing layer at opposite sides of the activated region; and forming a source and a drain separated from the gate and electrically connected to at least one of the first semiconductor layer and the second semiconductor layer.

According to at least one example embodiment, selectively activating the first region of the impurity containing layer may include: locating a mask having an opening exposing the first region on the impurity containing layer; and irradiating a laser onto the first region via the opening of the mask.

According to at least one example embodiment, the mask may be separated from the impurity containing layer.

According to at least one example embodiment, the mask may contact the impurity containing layer.

According to at least one example embodiment, the first semiconductor layer may include a gallium nitride-based material.

According to at least one example embodiment, the second semiconductor layer may have a single-layered or multi-layered structure including at least one material selected from nitrides containing at least one of aluminum (Al), gallium (Ga), indium (In), and boron (B).

According to at least one example embodiment, the impurity containing layer may include a group III-V based nitride.

According to at least one example embodiment, the p-type impurities may include magnesium (Mg).

According to at least one example embodiment, the activated region may include a plurality of regions having different doping levels, and the plurality of regions having different doping levels may be arranged in a horizontal direction.

According to at least one example embodiment, the plurality of regions having the different doping levels may be formed by using a plurality of masks.

According to at least one example embodiment, the activated region may be formed to have a width that is the same as or greater than a width of the gate.

According to at least one example embodiment, the method may further include removing a partial thickness of the non-activated region at the opposite sides of the activated region, after forming the activated region.

Additional advantages and novel features of these example embodiments of the invention will be set forth in part in the description that follows, and in part will become more apparent to those skilled in the art upon examination of the following or upon learning by practice of the invention.

BRIEF DESCRIPTION OF THE DRAWINGS

These and/or other example embodiments will become apparent and more readily appreciated from the following description of the embodiments, taken in conjunction with the accompanying drawings of which.

DETAILED DESCRIPTION

Figure 1:
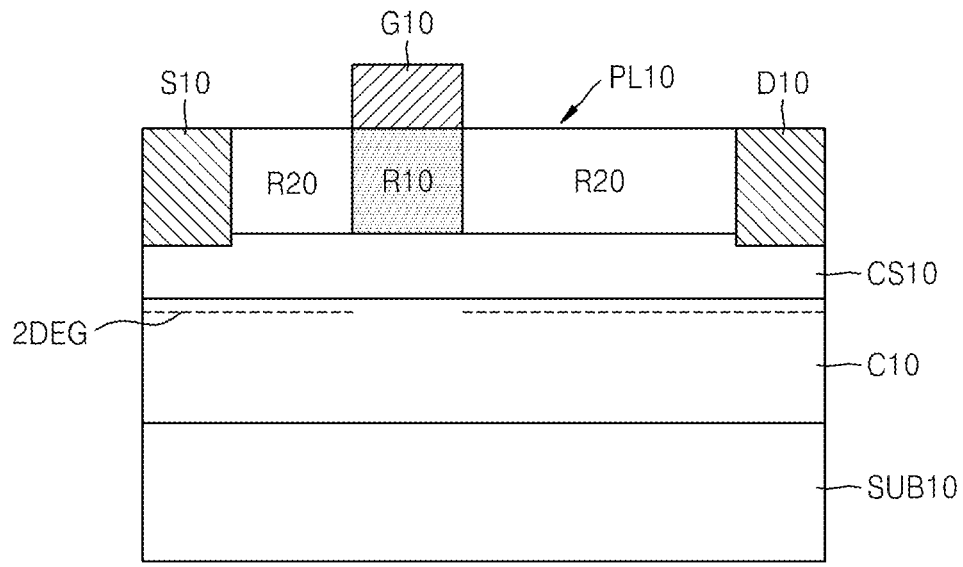
FIG. 1 is a cross-sectional view of a high electron mobility transistor (HEMT) according to at least one example embodiment.

Various example embodiments will now be described more fully with reference to the accompanying drawings in which example embodiments are shown.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Hereinafter, high electron mobility transistors (HEMTs) and methods of manufacturing the same will be described in detail with reference to accompanying example drawings. In the example drawings, the thicknesses of layers and regions may be exaggerated for clarity. Like reference numerals in the drawings denote like elements.

FIG. 1 is a cross-sectional view of an HEMT according to an example embodiment.

Referring to FIG. 1, according to at least one example embodiment, a channel layer C10 may be disposed on a substrate SUB10. The substrate SUB10 may include, for example, sapphire, silicon (Si), silicon carbide (SiC), gallium nitride (GaN), or the like. However, types of materials forming the substrate SUB10 are not limited thereto and may be modified variously. The channel layer C10 may be a semiconductor layer. The channel layer C10 may include a group III-V based compound semiconductor. For example, the channel layer C10 may include a GaN-based material (e.g., GaN). In this case, the channel layer C10 may be undoped GaN layer, but in some cases, may be a GaN layer doped with desired or alternatively predetermined impurities. Although not shown in FIG. 1, a desired or alternatively predetermined buffer layer may be disposed between the substrate SUB10 and the channel layer C10. The buffer layer (not shown) may reduce differences in lattice constant and thermal expansion coefficient between the substrate SUB10 and the channel layer C10. According to at least one example embodiment, the buffer layer may reduce or alternatively prevent deterioration of crystallinity of the channel layer C10. The buffer layer may have a single-layered or multi-layered structure including, for example, at least one material selected from nitrides containing at least one of aluminum (Al), gallium (Ga), indium (In), and boron (B). In more detail, the buffer layer may have a single-layered or multi-layered structure including at least one of various materials consisting of AlN, GaN, AlGaN, InGaN, AlInN, and AlGaInN. In some cases, a desired or alternatively predetermined seed layer (not shown) may be further disposed between the substrate SUB10 and the buffer layer. The seed layer may be a base layer for growing the buffer layer.

According to at least one example embodiment, a channel supply layer CS10 may be disposed on the channel layer C10. The channel supply layer CS10 may be a semiconductor layer that is different from the channel layer C10. The channel supply layer CS10 may be a layer that induces a 2-dimensional electron gas (2DEG) in the channel layer C10. The 2DEG may be formed in a region of the channel layer C10 adjacent to an interface between the channel layer C10 and the channel supply layer CS10. The channel supply layer CS10 may include a material (semiconductor) having different polarization characteristics and/or energy bandgap and/or lattice constant from those of the channel layer C10. The channel supply layer CS10 may include a material (semiconductor) having a higher polarizability and/or a wider energy bandgap than the polarizability and/or the energy bandgap of the channel layer C10. For example, the channel supply layer CS10 may have a single-layered or multi-layered structure including at least one material selected from nitrides containing at least one of Al, Ga, In, and B. According to at least one example embodiment, the channel supply layer CS10 may have a single-layered or multi-layered structure including at least one of various materials such as AlGaN, AlInN, InGaN, AlN, AlInGaN, and the like. The channel supply layer CS10 may be an undoped layer, or may be a layer doped with desired or alternatively predetermined impurities. A thickness of the channel supply layer CS10 may be about several tens of nanometers (nm), less or more. For example, the thickness of the channel supply layer CS10 may be about 50 nm or less.

According to at least one example embodiment, an impurity containing layer PL10 may be disposed on the channel supply layer CS10. For example, the impurity containing layer PL10 may include p-type impurities. The impurity containing layer PL10 may be formed of a group III-V based nitride containing the p-type impurities. For example, a base material of the impurity containing layer PL10 may include at least one of GaN, AlGaN, InN, AlInN, InGaN, and AlInGaN, and the p-type impurities may include magnesium (Mg). In more detail, the impurity containing layer PL10 may include a GaN layer containing p-type impurities or an AlGaN layer containing p-type impurities. According to at least one example embodiment, the impurity containing layer PL10 may have a thickness of several tens to several hundreds of nm. For example, the impurity containing layer PL10 may have a thickness of about 300 nm or less.

According to at least one example embodiment, the impurity containing layer PL10 may include a first region R10 that is a selectively activated region and a second region R20 that is a non-activated region. For example, the second region R20 may be disposed at opposite sides of the first region R10. The first region R10 may include an activated impurity region that is activated to generate holes. That is, the first region R10 may include a region including activated impurities. According to at least one example embodiment, a hole concentration of the first region R10 may be about $5\times10^{16}/cm^3$ to about $1\times10^{23}/cm^3$. For example, if an activation degree of the first region R10 is constant (uniform), the first region R10 may have a constant doping concentration (hole concentration). The second region R20 may include a region including impurities that are not activated (non-activated). That is, the impurities of the second region R20 may be in a non-activated state. The second region R20 may not include holes, or may rarely include holes. For example, a hole concentration of the second region R20 may be about $5\times10^{16}/cm^3$ or less. However, the hole concentrations of the first and second regions R10 and R20 may not be limited to the above examples and may vary. According to at least one example embodiment, when the impurities of the first region R10 are activated, the first region R10 may operate as an effective p-doped region, and when the impurities of the second region R20 are not activated, the second region R20 may not operate as a p-doped region. The term 'doped region' used in the present specification is used with respect to an effective doped region, and may be different from a region simply including impurities (non-activated impurity region).

According to at least one example embodiment, a depletion region may be formed in a region of the 2DEG corresponding to the first region R10 due to the first region R10, that is, the activated region of the impurity containing layer PL10. An energy bandgap of the channel supply layer CS10 under the first region R10 may be increased due to the first region R10, and accordingly, a 'disconnected region' (depletion region) may be formed in the 2DEG of the channel layer C10. In this regard, the first region R10 may be a depletion forming element or a depletion forming region. According to at least one example embodiment, due to the disconnected region, the HEMT of the present embodiment may have a normally-off characteristic. Also, due to the disconnected region, the HEMT of an example embodiment may have an enhancement-mode characteristic. Meanwhile, since the second region R20 that is not activated may not operate as an effective p-doped region, the second region R20 may not affect the 2DEG region corresponding thereto. That is, a physical property of the 2DEG region corresponding to the second region R20 may not be changed by the second region R20.

According to at least one example embodiment, the hydrogen concentration of the first region R10 in the impurity containing layer PL10 may be lower than the hydrogen concentration of the second region R20. The p-type impurities in the impurity containing layer PL10 may exist in a state of being coupled to the hydrogen, and the hydrogen may be removed in the activated first region R10, thereby generating holes by the p-type impurities. For example, the impurity containing layer PL10 may be formed to contain Mg—H bonds, and when a selected partial region (the first region R10) is activated, the Mg—H bonds may be dissociated in the selected region, that is, the hydrogen (H) is removed, and holes may be generated. Therefore, the hydrogen concentration of the first region R10 may be lower than the hydrogen concentration of the second region R20. Also, the doping concentration of the first region R10 may be adjusted according to a degree of removal of the hydrogen from the first region R10.

According to at least one example embodiment, a work function of the first region R10 in the impurity containing layer PL10 may be greater than a work function of the second region R20. The electric resistance of the second region R20 in the impurity containing layer PL10 may be higher than the electric resistance of the first region R10. The second region R20 may have a high resistance that is similar to the resistance of a typical insulator. In this regard, the second region R20 may be a high resistive region.

According to at least one example embodiment, a gate electrode G10 may be formed on the first region R10 of the impurity containing layer PL10. The gate electrode G10 may be formed of various metal or metal compounds. The gate electrode G10 may have a width that is similar to or the same as a width of the first region R10. Otherwise, the gate electrode G10 may have a width that is less than a width of the first region R10. That is, the first region R10 may have a width that is greater than a width of the gate electrode G10. In some cases, the gate electrode G10 may have a width that is greater than a width of the first region R10.

According to at least one example embodiment, a source electrode S10 and a drain electrode D10 may be disposed on the channel supply layer CS10 at opposite sides of the gate electrode G10. The second regions R20 may be disposed between the source electrode S10 and the first region R10 and between the drain electrode D10 and the first region R10. The second region R20 may not exist between the source electrode S10 and the channel supply layer CS10 and between the drain electrode D10 and the channel supply layer CS10. For example, after removing some parts of the second region R20 to expose the channel supply layer CS10, the source electrode S10 and the drain electrode D10 may be formed on the exposed channel supply layer CS10. The source electrode S10 and the drain electrode D10 may be electrically connected to the 2DEG. The source electrode S10 may be closer to the gate electrode G10 than the drain electrode D10 is. For example, a distance between the source electrode S10 and the gate electrode G10 may be less than a distance between the drain electrode D10 and the gate electrode G10. However, the example embodiments are not limited thereto, that is, relative distances between the source electrode S10 or the drain electrode D10 and the gate electrode G10 may vary. The source electrode S10 and the drain electrode D10 may ohmic contact the channel supply layer CS10. In some cases, an ohmic contact layer (not shown) may be further disposed between the source electrode S10 and the channel supply layer CS10 and/or between the drain electrode D10 and the channel supply layer CS10.

According to at least one example embodiment, the source electrode S10 and the drain electrode D10 may have structures inserted into the channel supply layer CS10 or into the channel layer C10. For example, the channel supply layer CS10 and the channel layer C10 are partially etched (recessed), and then, the source electrode S10 and the drain electrode D10 may be formed in etched regions (recess regions). For example, a depth of the etched region (recess region) may be deeper than that of the 2DEG. Therefore, the source electrode S10 and the drain electrode D10 may directly contact side surfaces of the 2DEG. Alternatively, after etching a portion of the channel supply layer CS10 to a desired or alternatively predetermined depth, the source and drain electrodes S10 and D10 may be formed. For example, after etching a portion of the channel supply layer CS10 to the interface between the channel layer C10 and the channel supply layer CS10 or to a shallower depth than the interface, the source and drain electrodes S10 and D10 may be formed in the etched region (recess region). Alternatively, configurations of the source and drain electrodes S10 and D10 may be variously modified.

Figure 2:
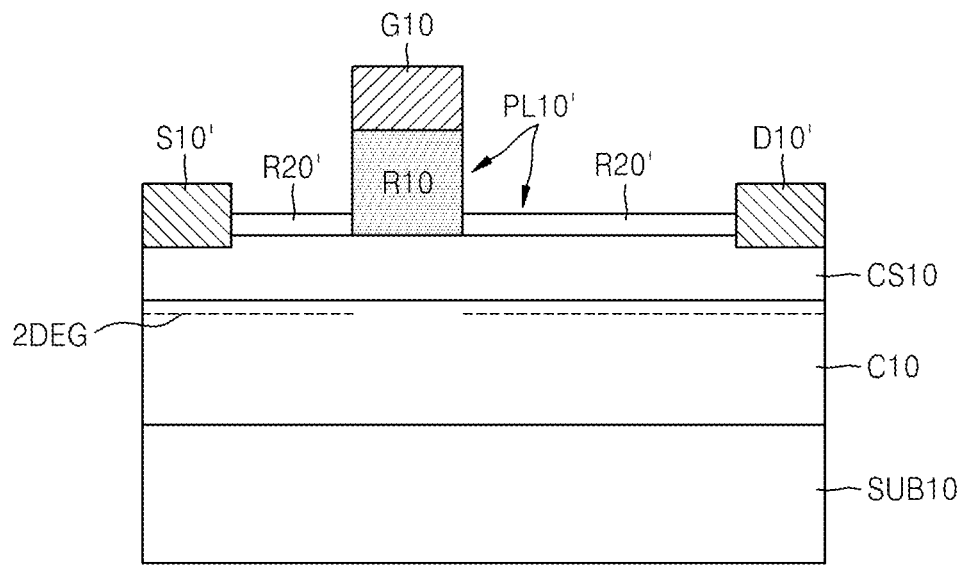
FIG. 2 is a cross-sectional view of an HEMT according to another example embodiment.

In the example embodiment shown in FIG. 1, the second region R20 and the first region R10 have about the same thickness as each other; however, according to another example embodiment, the second region R20 may have a thickness that is different from a thickness of the first region R10 as shown in FIG. 2.

Referring to FIG. 2, a second region R20' may have a thickness less than a thickness of the first region R10. After forming the gate electrode G10, the second regions R20 (see FIG. 1) at opposite sides of the gate electrode G10 and the first region R10 are etched to a desired or alternatively predetermined thickness, and a source electrode S10' and a drain electrode D10' may be formed. In FIG. 2, reference numeral PL10' denotes an impurity containing layer. In FIG. 2, other configurations except for the thickness of the second region R20' less than that of the first region R10 may be the same as or similar to those of FIG. 1.

In the example embodiments, the impurity containing layer PL10 or PL10' including the first region R10 that is a selectively activated impurity region and the second region R20 or R20' that is non-activated impurity region is used, and thus, reduction in a carrier density of a channel and increase in on-resistance due to an etching damage may be reduced or alternatively prevented, and at the same time, a normally-off device (HEMT) having excellent performances may be realized. This will be described in more detail later.

Figure 3:
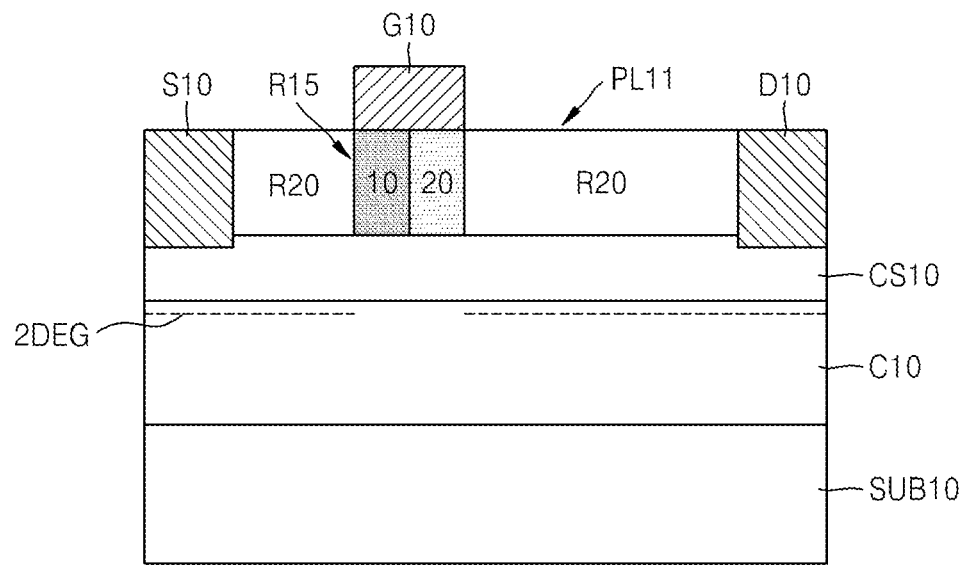
FIG. 3 is a cross-sectional view of an HEMT according to another example embodiment.

FIG. 3 is a cross-sectional view of an HEMT according to another example embodiment.

Referring to FIG. 3, a first region R15 that is activated in an impurity containing layer PL11 may have a plurality of regions having different doping levels (doping concentrations) from each other, for example, a first doped region 10 and a second doped region 20. The plurality of regions 10 and 20 having different doping levels may be arranged laterally, that is, for example, in a horizontal direction. The first doped region 10 may be disposed closer to the source electrode S10, and the second doped region 20 may be disposed closer to the drain electrode D10. The first and second doped regions 10 and 20 having different doping levels may be connected in parallel between the channel supply layer CS10 and the gate electrode G10. The first and second doped regions 10 and 20 having different doping levels may be considered as regions having different degrees of activation. For example, the first and second doped regions 10 and 20 may be the regions activated with different energy levels from each other. When the activation energy is high, the doping level (doping concentration) may be increased. The first and second doped regions 10 and 20 may have different hole concentrations from each other. In a broader sense, the first and second doped regions 10 and 20 may be a plurality of regions having different properties.

According to examples of the present embodiment, the doping level of the first region R15 may be adjusted in a lateral direction so as to easily control a property of the corresponding channel region (2DEG region). Moreover, performances and operating characteristics of the HEMT may be improved. For example, concentration of an electric field on the semiconductor layers C10 and CS10 under or around the gate electrode G10 may be reduced. In particular, the concentration of the electric field and the voltage on a portion of the channel layer C10, which corresponds to a drain side edge of the gate electrode G10, may be reduced or alternatively prevented. Due to the dispersion of the electric field, a withstand voltage characteristic of the HEMT may be improved. Also, when the first region R15 as shown in FIG. 3 is used, the leakage current through the gate electrode G10 may be reduced or alternatively prevented or suppressed, and thus, characteristics of the HEMT may be improved.

Figure 4:
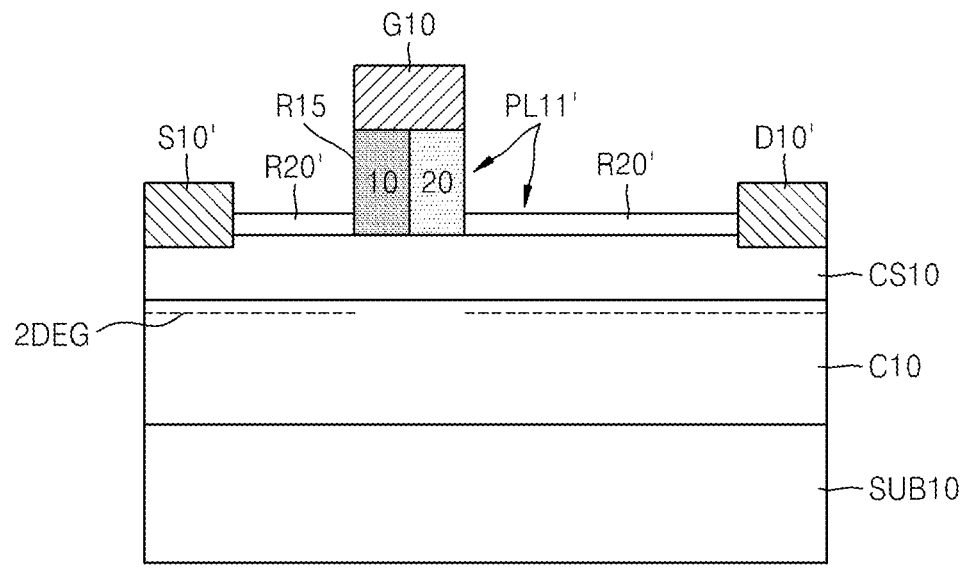
FIG. 4 is a cross-sectional view of an HEMT according to another example embodiment.

According to another example embodiment, the second region R20 shown in FIG. 3 may have a thickness less than that of the first region R15 as shown in FIG. 4. In FIG. 4, a thickness of a second region R20' may be less than that of the first region R15. The structure shown in FIG. 4 may be the same as or similar to the structure of FIG. 2, except that the first region R10 may be replaced with the first region R15 of FIG. 3.

Figure 5:
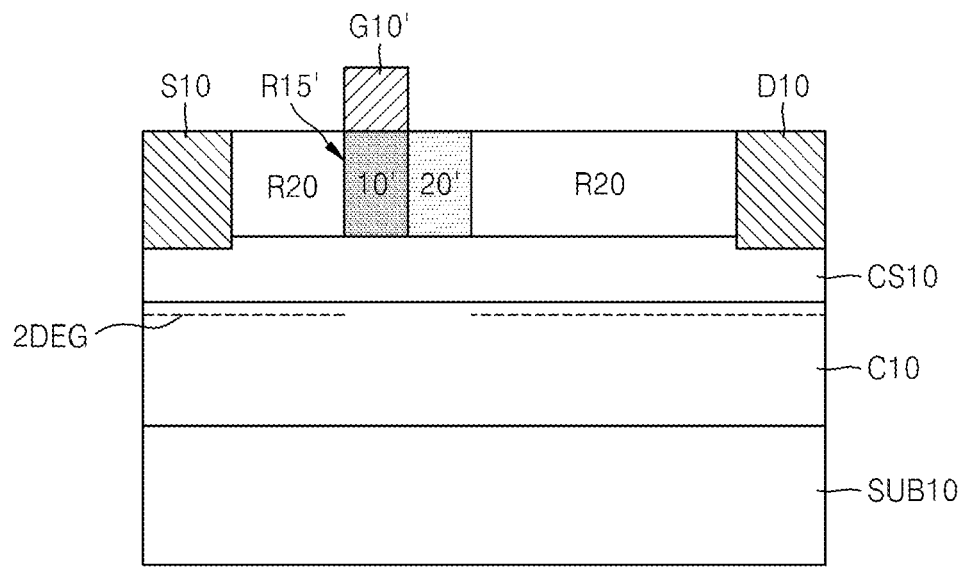
FIG. 5 is a cross-sectional view of an HEMT according to another example embodiment.
Figure 6:
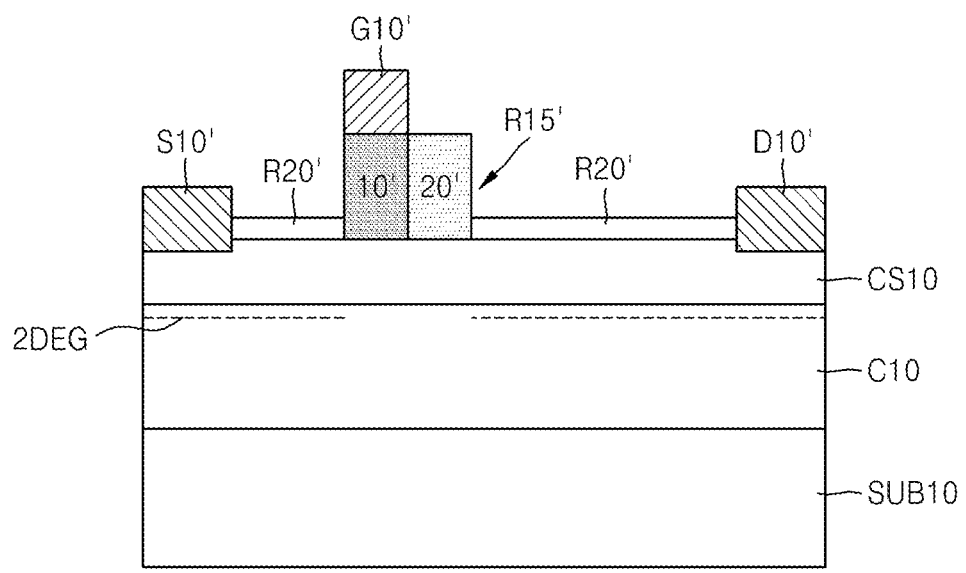
FIG. 6 is a cross-sectional view of an HEMT according to another example embodiment.

According to the example embodiments shown in FIGS. 1 through 4, the gate electrode G10 and the first region R10 or R15 may have the same widths as each other; however, the gate electrode G10 and the first region R10 or R15 may have different widths from each other. For example, the first region R10 or R15 may have a width that is greater than a width of the gate electrode G10, as shown in FIGS. 5 and 6. The structure shown in FIG. 5 may be modified from the structure of FIG. 3, and the structure shown in FIG. 6 may be modified from the structure of FIG. 4.

Referring to FIGS. 5 and 6, a first region R15' may include a plurality of regions having different doping levels (doping concentrations), for example, a first doped region 10' and a second doped region 20'. A gate electrode G10' may have a width that is less than a width of the first region R15'. For example, the gate electrode G10' may be disposed on the first doped region 10' with a width that is the same as or similar to a width of the first doped region 10'. In this case, the doping level (doping concentration) of the first doped region 10' may be greater than the doping level (doping concentration) of the second doped region 20'.

In FIGS. 5 and 6, the first region R15' is expanded to a side of the gate electrode G10', that is, a right side (drain side) of the gate electrode G10'; however, the first region R15' may be expanded toward the other side of the gate electrode G10', that is, a left side (source side) of the gate electrode G10'. In some cases, the first region R15' may be expanded toward opposite sides of the gate electrode G10'.

FIGS. 7 through 11 are graphs exemplary showing variation in the doping concentration of the activated region (first region) applied to the HEMT according to the example embodiments. FIGS. 7 through 11 show variations in the doping concentration of the activated region (first region) according to a lateral position (location) from the source electrode S toward the drain electrode D. In FIGS. 7 through 11, the doping concentration may be an effective doping concentration. Also, the doping concentration in FIGS. 7 through 11 may correspond to the hole concentration and to the activation degree.

Figure 7:
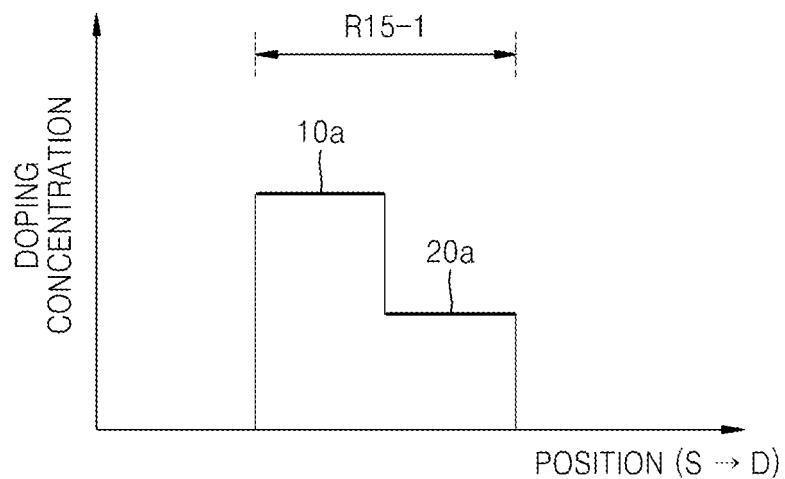
FIGS. 7 through 11 are graphs exemplary showing variations in doping concentration of an activated region, which may be applied to an HEMT according to example embodiments.

Referring to FIG. 7, the activated first region R15-1 may include a first doped region 10a and a second doped region 20a, and a doping concentration of the first doped region 10a may be higher than a doping concentration of the second doped region 20a. The first doped region 10a and the second doped region 20a may respectively correspond to the first doped regions 10 and 10' and the second doped regions 20 and 20' in FIGS. 3 through 6.

Figure 8:
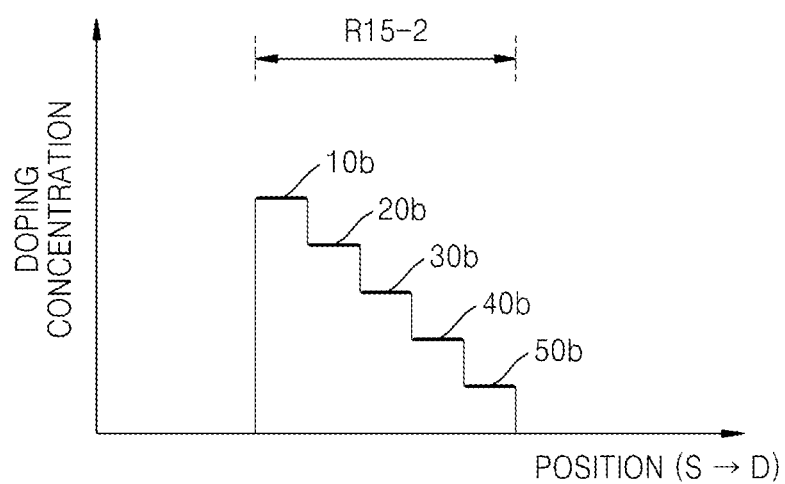

Referring to FIG. 8, the activated first region R15-2 may include a plurality of doped regions 10b, 20b, 30b, 40b, and 50b, the doping concentrations of which may be gradually reduced from the source electrode S toward the drain electrode D.

Figure 9:
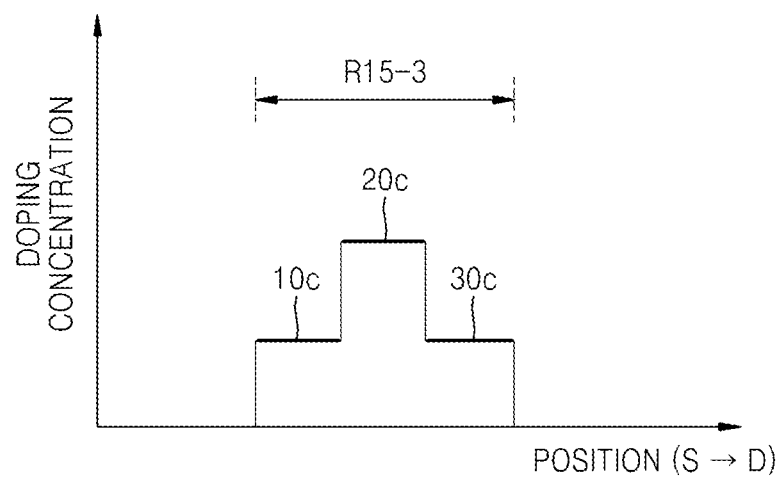

Referring to FIG. 9, the activated first region R15-3 may include two low-doped regions 10c and 30c having relatively low doping concentrations, and a high-doped region 20c having a relatively high doping concentration between the two low-doped regions 10c and 30c. That is, the activated first region R15-3 may include the low-doped regions 10c and 30c at opposite sides of the high-doped region 20c.

Figure 10:
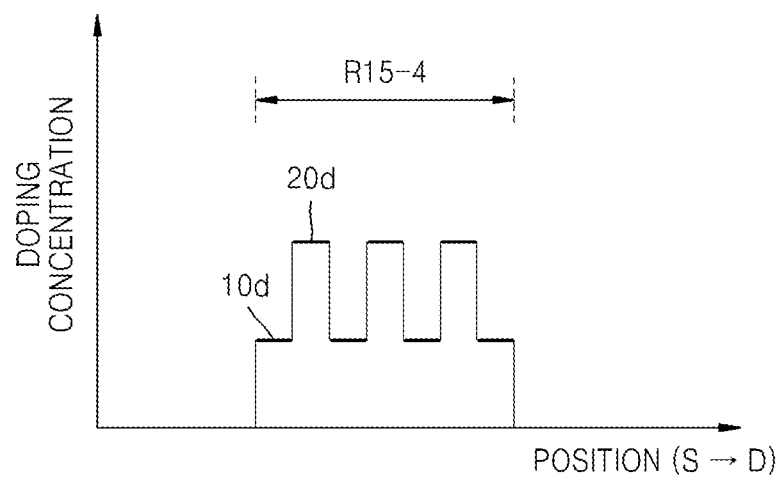

Referring to FIG. 10, the activated first region R15-4 may have a doping profile, in which a low-doped region 10d having relatively low doping concentration and a high-doped region 20d having relatively high doping concentration are alternately repeated.

Figure 11:
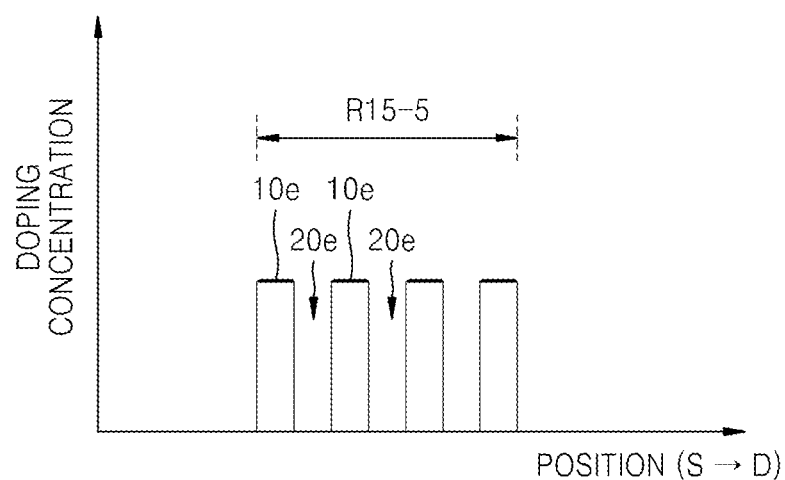

Referring to FIG. 11, the activated first region R15-5 may include undoped regions 20e between a plurality of doped regions 10e. That is, the activated first region R15-5 may include non-activated regions 20e between a plurality of activated unit regions 10e.

The doping concentration profiles shown in FIGS. 7 through 11 are exemplary, and may be variously modified. For example, left and right sides of the profiles shown in FIGS. 7 and 8 may be reversed, or at least two of the profiles shown in FIGS. 7 through 11 may be mixed. Otherwise, the doping concentration profile may be variously modified.

Like the example embodiments, the doping level (doping concentration) of the activated region may be adjusted in the lateral direction, and thus, the performances and characteristics of the HEMT may be improved. Also, the characteristics of the HEMT may be more easily controlled according to purposes thereof.

FIGS. 12A through 12F are cross-sectional views illustrating a method of manufacturing an HEMT, according to an example embodiment.

Figure 12A:
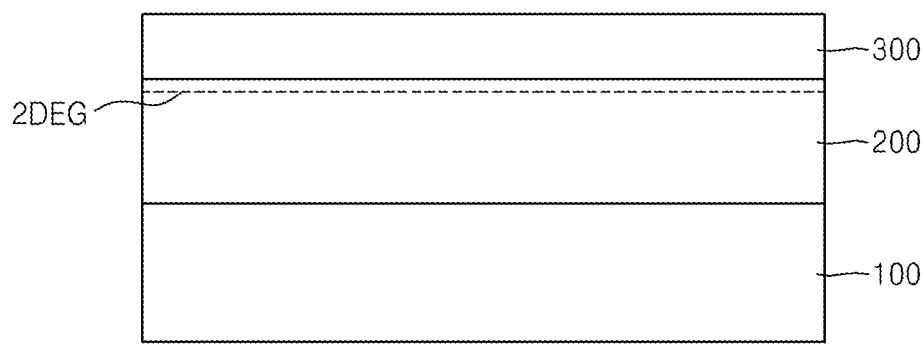
FIGS. 12A through 12F are cross-sectional views illustrating a method of manufacturing an HEMT, according to at least one example embodiment.

Referring to FIG. 12A, a channel layer 200 may be formed on a substrate 100. The substrate 100 may include, for example, sapphire, Si, SiC, GaN, or the like. However, the substrate 100 is not limited thereto, but may be modified variously. The channel layer 200 may be a semiconductor layer. The channel layer 200 may include a group III-V based compound semiconductor. For example, the channel layer 200 may include a GaN-based material (e.g., GaN). In this case, the channel layer 200 may be an undoped GaN layer, in some cases, may be a GaN layer doped with desired or alternatively predetermined impurities. Although not shown in the drawings, a desired or alternatively predetermined buffer layer may be further formed between the substrate 100 and the channel layer 200. The buffer layer may be formed to reduce differences in lattice constant and thermal expansion coefficient between the substrate 100 and the channel layer 200, thereby reducing or alternatively preventing the crystallinity of the channel layer 100 from degrading. The buffer layer may have a single-layered or multi-layered structure including at least one material selected from nitrides containing at least one of Al, Ga, In, and B. In more detail, the buffer layer may be formed to have a single-layered or multi-layered structure including at least one of various materials consisting of AlN, GaN, AlGaN, InGaN, AlInN, and AlGaInN. If necessary, a seed layer (not shown) may be further formed between the substrate 100 and the buffer layer. The seed layer may be a base layer for growing the buffer layer.

According to at least one example embodiment, a channel supply layer 300 may be formed on the channel layer 200. The channel supply layer 300 may be formed of a different semiconductor from the channel layer 200. The channel supply layer 300 may be a layer that induces a 2DEG in the channel layer 200. The 2DEG may be formed in the channel layer 200 under an interface between the channel layer 200 and the channel supply layer 300. The channel supply layer 300 may be formed of a material (semiconductor) having different polarization characteristics and/or energy bandgap and/or lattice constant from those of the channel layer 200. The channel supply layer 300 may be formed of a material (semiconductor) having higher polarizability and/or wider energy bandgap than those of the channel layer 200. For example, the channel supply layer 300 may be formed to have a single-layered or multi-layered structure including at least one material selected from the nitrides containing at least one of Al, Ga, In, and B. In more detail, the channel supply layer 300 may have a single-layered or multi-layered structure including at least one of various materials consisting of AlGaN, AlInN, InGaN, AlN, and AlInGaN. The channel supply layer 300 may be an undoped layer, or may be a layer doped with desired or alternatively predetermined impurities. The channel supply layer 300 may be formed to a thickness of several tens of nm or less, for example, about 50 nm or less.

Figure 12B:
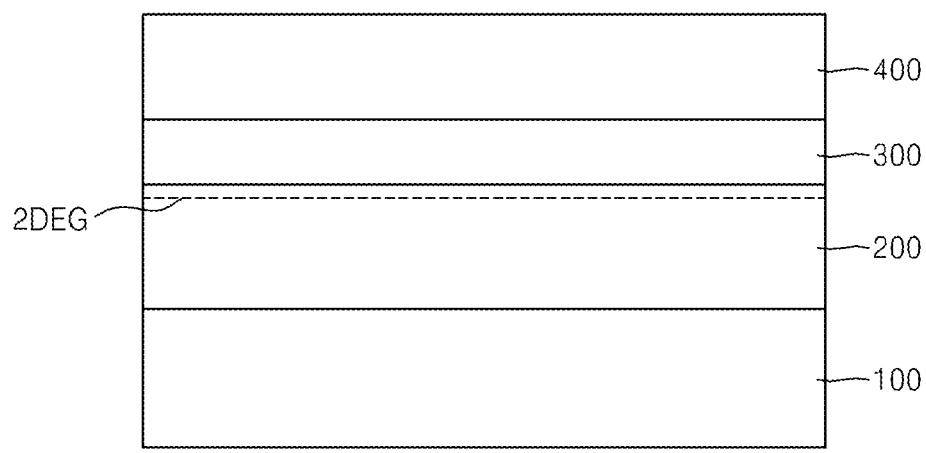

Referring to FIG. 12B, an impurity containing layer 400 may be formed on the channel supply layer 300. The impurity containing layer 400 may include p-type impurities. The impurity containing layer 400 may be formed of a group III-V based nitride containing the p-type impurities. For example, a base material of the impurity containing layer 400 may include at least one of GaN, AlGaN, InN, AlInN, InGaN, and AlInGaN, and the p-type impurities may be magnesium (Mg). In more detail, the impurity containing layer 400 may be a GaN layer containing p-type impurities or an AlGaN layer containing p-type impurities. Meanwhile, the impurity containing layer 400 may have a thickness of several tens to several hundreds of nm or more. For example, the impurity containing layer 400 may have a thickness of about 300 nm or less.

The p-type impurities contained in the impurity containing layer 400 may be in a non-activated state. In more detail, the p-type impurity included in the impurity containing layer 400, for example, Mg, may be bonded to hydrogen (H) dissociated from a source gas of nitrogen used to form the impurity containing layer 400 to make Mg—H bonds. In this case, holes due to Mg may not be generated. Therefore, the impurity containing layer 400 may not operate as an effective p-doped layer. That is, the impurity containing layer 400 may not be an effective p-doped region.

Figure 12C:
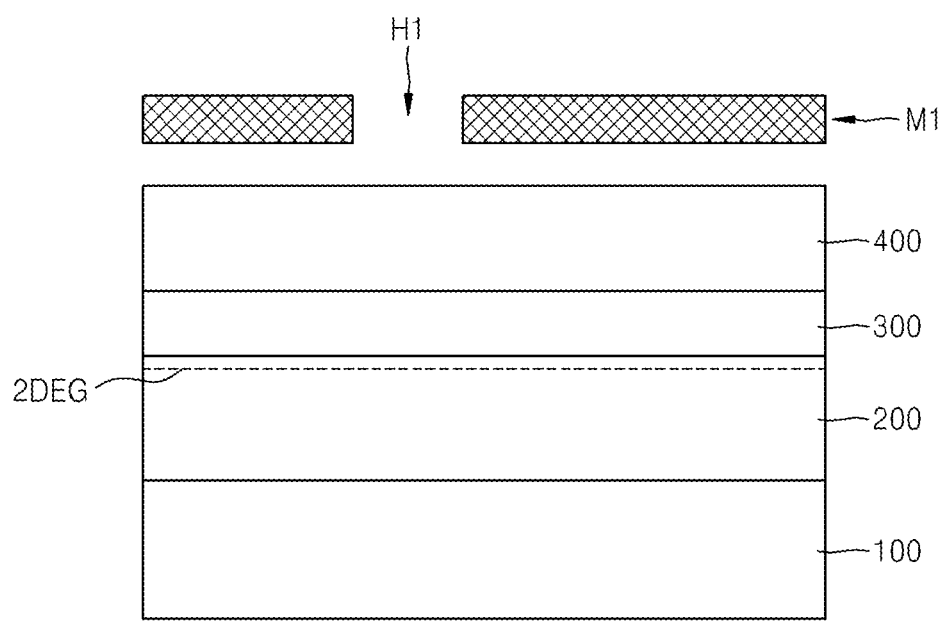

Referring to FIG. 12C, a desired or alternatively predetermined mask M1 may be located on the impurity containing layer 400. The mask M1 may have an opening H1 exposing a desired or alternatively predetermined region (hereinafter, referred to as a first region) of the impurity containing layer 400. The mask M1 may be a desired or alternatively predetermined distance apart from an upper surface of the impurity containing layer 400. However, in some cases, the mask M1 may contact the impurity containing layer 400, or may be close to the impurity containing layer 400.

Figure 12D:
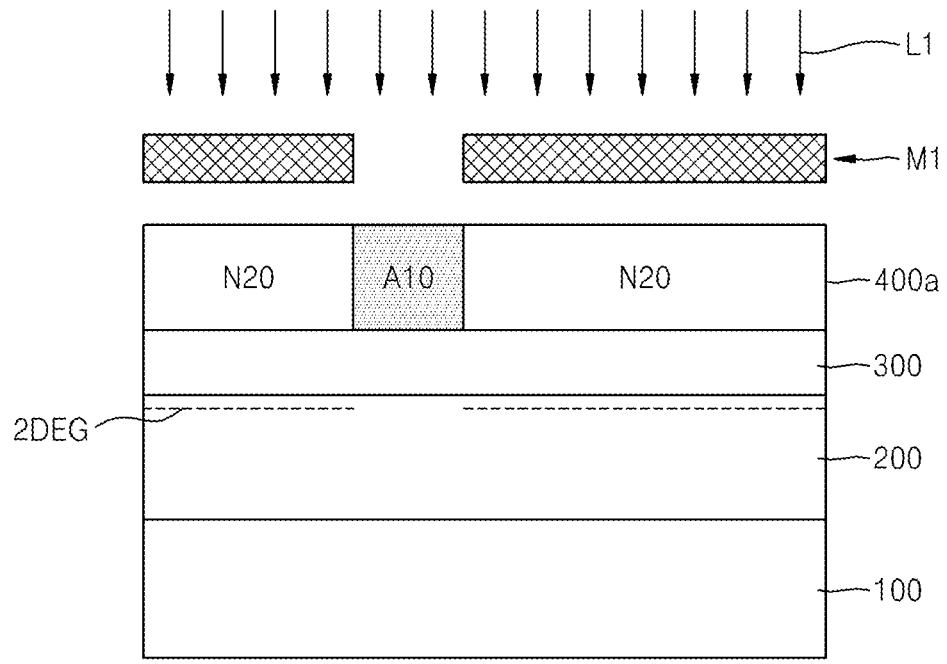

Referring to FIG. 12D, laser L1 may be irradiated onto the impurity containing layer 400 from above the mask M1 via the opening H1 in order to selectively activate the exposed region (the first region) of the impurity containing layer 400. As such, an activated region A10 may be formed in the impurity containing layer 400. Hereinafter, the impurity containing layer 400 in which the activated region A10 is formed is denoted by a reference numeral 400a. A remaining region except for the activated region A10 of the impurity containing layer 400a may be a non-activated region N20. The non-activated region N20 may be disposed at opposite sides of the activated region A10. By the activation process, hydrogen (H) atoms may be removed from the first region of the impurity containing layer 400, thereby generating holes by the p-type impurities. Therefore, hydrogen content (hydrogen concentration) of the activated region A10 may be less than the hydrogen content (hydrogen concentration) of the non-activated region N20. The hole concentration of the activated region A10 may be about $5\times10^{16}/cm^3$ to about $1\times10^{20}/cm^3$. The hole concentration of the non-activated region N20 may be about $5\times10^{16}/cm^3$ or less.

According to at least one example embodiment, since the impurities in the activated region A10 are activated, the activated region A10 may operate as an effective p-doped region, and since the impurities in the non-activated region N20 are not activated, the non-active region N20 may not operate as a p-doped region. Due to the activated region A10 of the impurity containing layer 400a, a depletion region may be formed in the 2DEG region corresponding to the activated region A10. The energy bandgap of the channel supply layer 300 under the activated region A10 may be increased due to the activated region A10, and accordingly, a 'disconnected region' (depletion region) may be formed in the 2DEG. In this regard, the activated region A10 may be a depletion forming element or a depletion forming region. Meanwhile, since the non-activated region N20 does not operate as the effective p-doped region, the non-activated region N20 may not affect the corresponding 2DEG region. That is, a physical property of the 2DEG region corresponding to the non-activated region N20 may not be changed by the non-activated region N20.

According to at least one example embodiment, a work function of the activated region A10 may be greater than that of the non-activated region N20. The electric resistance of the non-activated region N20 may be greater than that of the activated region A10. The non-activated region N20 may have high resistance similar to that of an insulator. In this regard, the non-activated region N20 may be a high resistive region.

The laser L1 used in the process illustrated in FIG. 12D may be, for example, excimer laser. For example, the laser L1 may be KrF excimer laser. However, the example embodiments are not limited thereto, and a kind of the laser L1 may be variously modified. The laser L1 may have a power of about $1$ mJ/cm$^2$ to about $50$ J/cm$^2$, and a wavelength of about 150 nm to about 450 nm. An irradiation process of the laser L1 may be performed by using a laser scanner or a laser stepper. Also, the irradiation process of the laser L1 may be performed under an $N_2$ gas atmosphere or an atmosphere of mixture gas including $N_2$ and $O_2$, in some cases, may be performed under air. The irradiation process of the laser L1 may be performed at room temperature or at a temperature similar to room temperature.

According to at least one example embodiment, the mask M1 used in the process shown in FIG. 12D may be the same as a photomask that is used to form a gate electrode (500 of FIG. 12E) in a next process. Therefore, there may not be any serious burden for performing an additional process when performing the selective activation process shown in FIG. 12D.

Figure 12E:
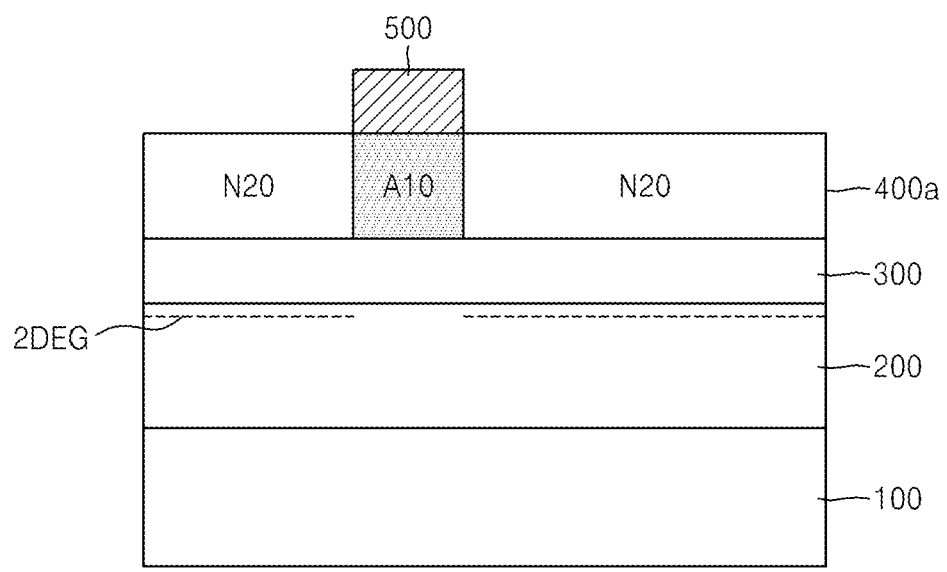

Referring to FIG. 12E, a gate electrode 500 may be formed on the activated region A10. The gate electrode 500 may be formed of various metal or metal compounds. The gate electrode 500 may be formed by a mask (photomask) (not shown) that is the same as the mask M1 used in the process shown in FIG. 12D.

Figure 12F:
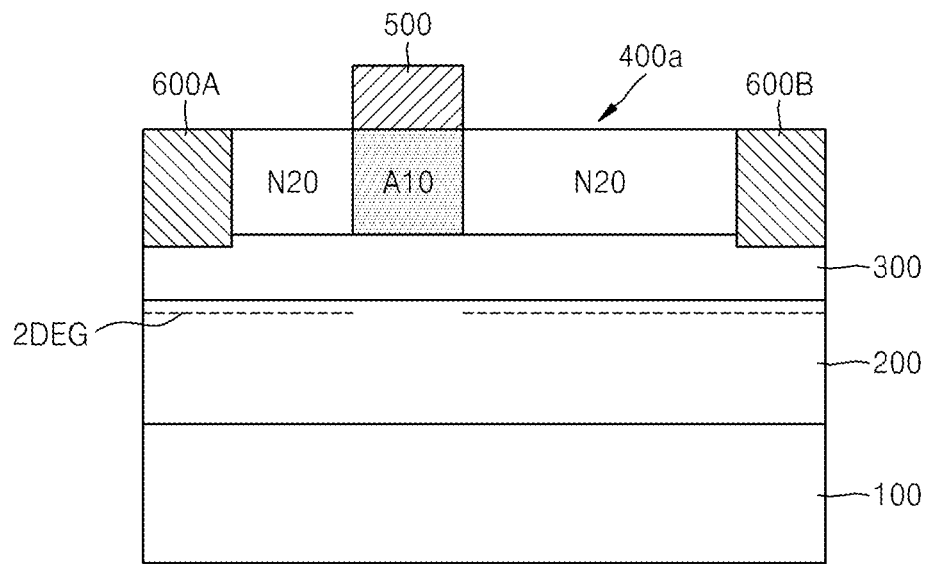

Referring to FIG. 12F, a source electrode 600A and a drain electrode 600B may be formed on opposite sides of the gate electrode 500. After exposing the channel supply layer 30 by removing a portion of the non-activated region N20 of the impurity containing layer 400a, the source electrode 600A and the drain electrode 600B may be formed on the exposed channel supply layer 300. The source electrode 600A may be closer to the gate electrode 500 than the drain electrode 600B is. In other words, a distance between the source electrode 600A and the gate electrode 500 may be less than a distance between the drain electrode 600B and the gate electrode 500. However, the example embodiments are not limited thereto, and the relative distances between the source electrode 600A and the drain electrode 600B, and the gate electrode 500 may vary. The source electrode 600A and the drain electrode 600B may form ohmic contact with the channel supply layer 300. If necessary, an ohmic contact layer (not shown) may be further formed between the source electrode 600A and the channel supply layer 300 and between the drain electrode 600B and the channel supply layer 300.

According to at least one example embodiment, the source electrode 600A and the drain electrode 600B may be inserted into the channel supply layer 300 or the channel layer 200. For example, some portions of the channel supply layer 300 and the channel layer 200 are etched (recessed), and after that, the source and drain electrodes 600A and 600B may be formed on the etched region (recessed region). Here, a depth of the etched region (recess region) may be deeper than the depth of the 2DEG. Therefore, the source and drain electrodes 600A and 600B may directly contact a side surface of the 2DEG. Otherwise, after etching a portion of the channel supply layer 300 to a desired or alternatively predetermined depth, the source and drain electrodes 600A and 600B may be formed. For example, after etching a portion of the channel supply layer 300 to the interface between the channel layer 200 and the channel supply layer 300 or to a shallower depth than the interface, the source and drain electrodes 600A and 600B may be formed on the etched region (recessed region). Otherwise, the configurations of the source and drain electrodes 600A and 600B may be modified variously.

According to example embodiments, a partial region of the impurity containing layer 400 may be selectively activated, and the gate electrode 500 and the source and drain electrodes 600A and 600B may be formed in a state where the non-activated region N20 remains on opposite sides of the activated region A10. Thus, reduction in the carrier density of the channel (2EDG region) due to an etching damage or increase in the ON-resistance may be reduced or alternatively prevented, and at the same time, a normally-off device (HEMT) having excellent performances may be manufactured.

Figure 17A:
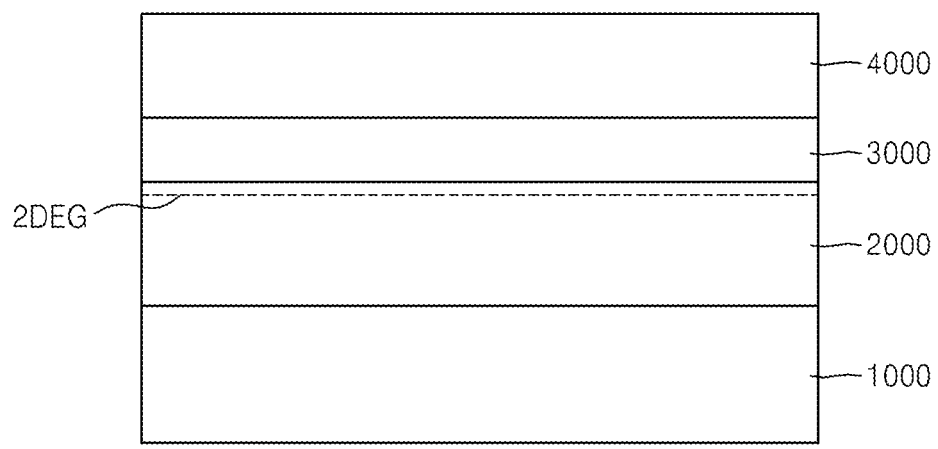
FIGS. 17A through 17C are cross-sectional views illustrating a method of manufacturing an HEMT, according to a conventional comparative example.
Figure 17B:
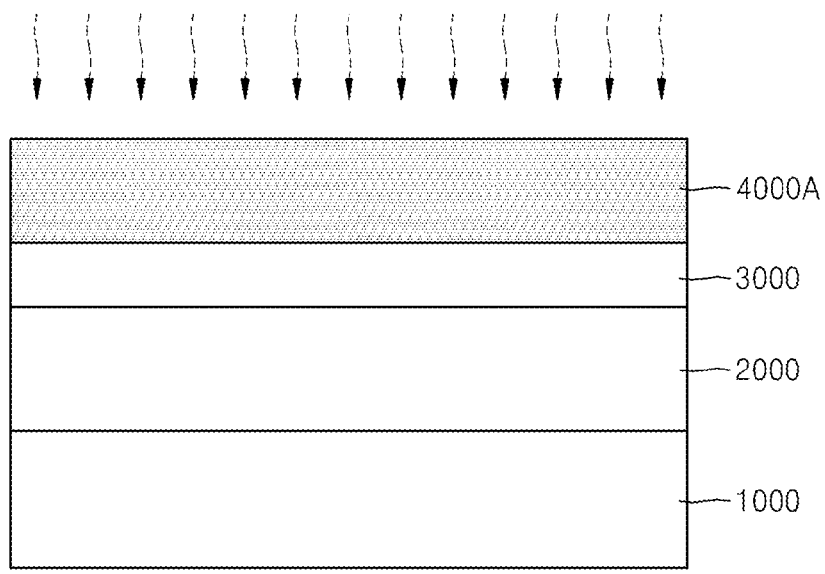
Figure 17C:
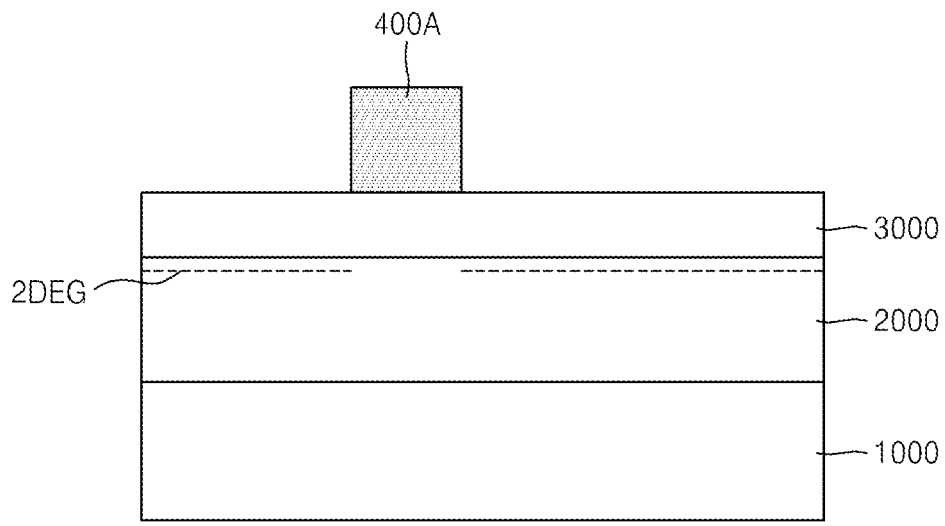

FIGS. 17A through 17C are cross-sectional views illustrating a method of manufacturing an HEMT, according to a comparative example. Referring to FIGS. 17A through 17C, problems (issues) of the comparative example will be described.

Referring to FIG. 17A, a channel layer 2000, a channel supply layer 3000, and an impurity containing layer 4000 may be sequentially formed on a substrate 1000. The channel layer 2000, the channel supply layer 3000, and the impurity containing layer 4000 may be respectively the same as the channel layer 200, the channel supply layer 300, and the impurity containing layer 400 shown in FIG. 12B.

Referring to FIG. 17B, the impurity containing layer 4000 may be entirely activated to obtain an activated impurity layer 4000A. Here, the entire impurity containing layer 4000 may be activated by using a thermal annealing process. Since the impurity layer 4000A is formed by activating the entire impurity containing layer 4000, the 2DEG region may become a depletion region entirely.

Referring to FIG. 17C, the impurity layer 4000A may be patterned by using a desired or alternatively predetermined etching mask (not shown) to form a depletion forming layer 400A. The 2DEG region corresponding to the depletion forming layer 400A may be selectively depleted, and the other 2DEG region at opposite sides of the above 2DEG region may be recovered (regenerated). However, during the etching (patterning) process for forming the depletion forming layer 400A, the channel supply layer 3000 may be damaged, and accordingly, characteristic of the remaining 2DEG region may be degraded. Also, due to a possibly uneven thickness of the activated impurity layer (4000A of FIG. 17B) and the possibly non-uniform etching process, damaged degree of the channel supply layer 3000 may vary according to regions. Therefore, various properties of the remaining 2DEG region may be not uniform. As such, characteristics of the manufactured HEMT may be degraded.

Figure 18:
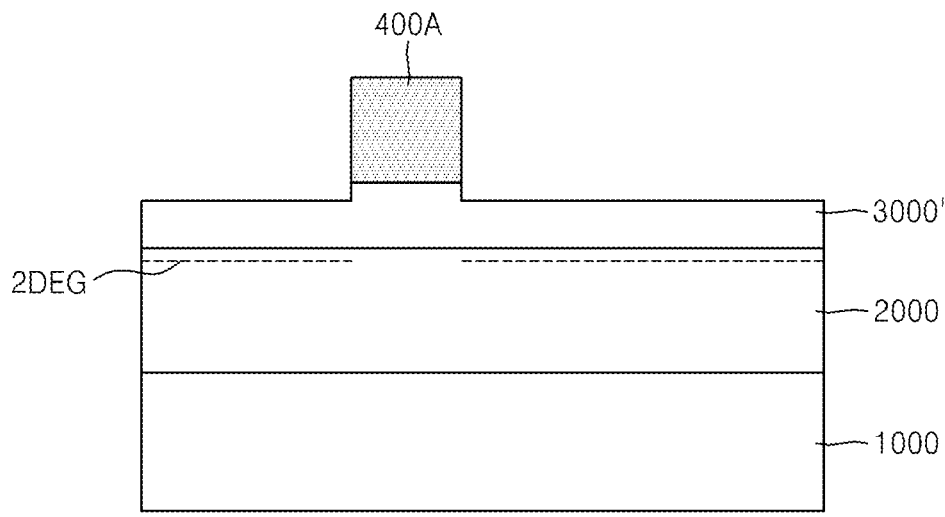
FIG. 18 is a cross-sectional view illustrating a method of manufacturing an HEMT, according to another conventional comparative example.

Also, in an actual process, it may be difficult to perform the etching process exactly to the interface between the channel supply layer 3000 and the depletion forming layer 400A as shown in FIG. 17C. For example, an over-etch or an under-etch phenomenon may occur. FIG. 18 shows a case where the over-etch occurs, and FIG. 19 shows a case where the under-etch occurs.

Referring to FIG. 18, an upper portion of a channel supply layer 3000' is partially removed, and thus, the carrier density in the 2DEG region may be reduced.

Figure 19:
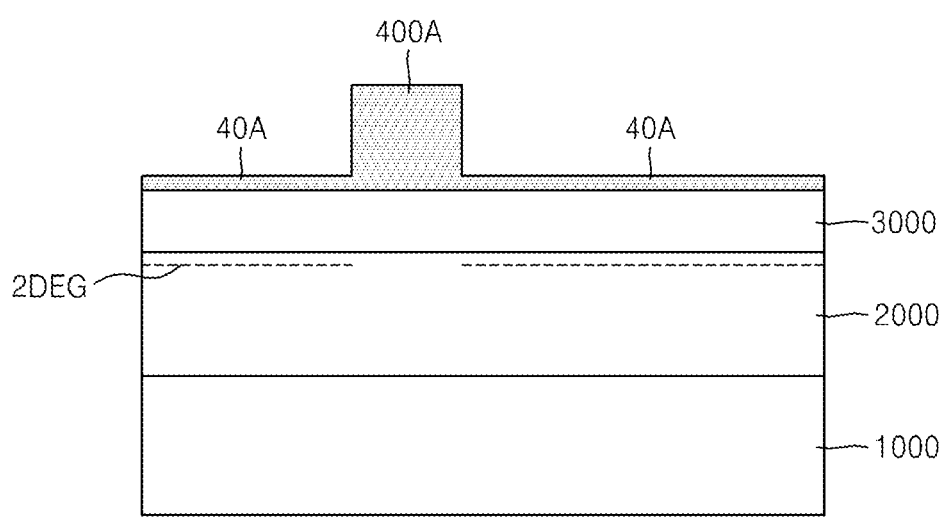
FIG. 19 is a cross-sectional view illustrating a method of manufacturing an HEMT, according to another conventional comparative example.

Referring to FIG. 19, a part 40A of the activated impurity layer remains on opposite sides of the depletion forming layer 400A, and accordingly, the carrier density in the 2DEG region may be reduced. Here, since the remaining part 40A of the activated impurity layer is an effective p-doped region, the part 40A may badly affect the corresponding 2DEG region.

Thus, according to the examples shown in FIGS. 18 and 19, the carrier density of the channel (2DEG) is reduced and the ON-resistance is increased. Also, according to the example shown in FIG. 17C, an upper surface of the channel supply layer 30 may be damaged, thereby degrading characteristics of the channel (2DEG). As described above, an HEMT having excellent performance may not be obtained by the method of activating the entire impurity containing layer 4000 (see FIG. 17A) and etching (patterning) the activated impurity layer 4000A (see FIG. 17B) to obtain the depletion forming layer 400A (see FIG. 17C).

However, according to the example embodiment illustrated with reference to FIGS. 12A through 12F, a portion of the impurity containing layer 400 is selectively activated, and manufacturing processes are performed in a state where the non-activated region N20 is disposed at the opposite sides of the activated region, and thus, problems caused by the etching damage, the over-etch, or the under-etch may be reduced or alternatively prevented. Therefore, according to example embodiment, the HEMT having a low ON-resistance and high carrier density in the channel may be manufactured more easily.

Figure 13A:
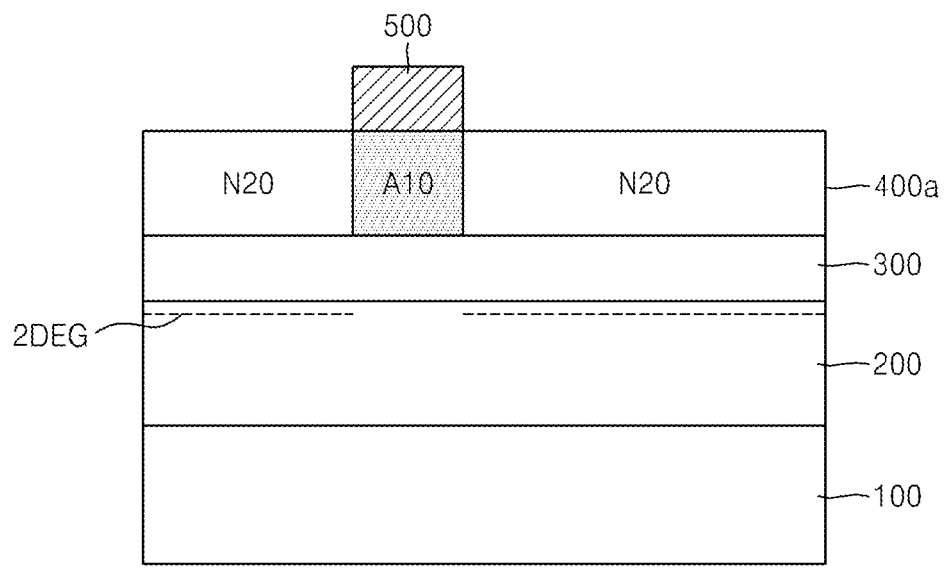
FIGS. 13A through 13C are cross-sectional views illustrating a method of manufacturing an HEMT, according to another example embodiment.
Figure 13B:
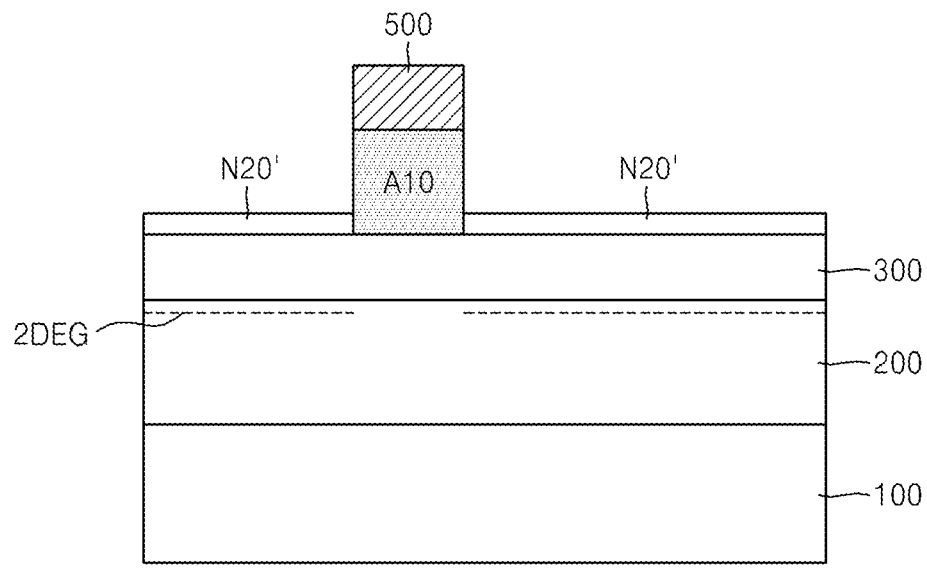
Figure 13C:
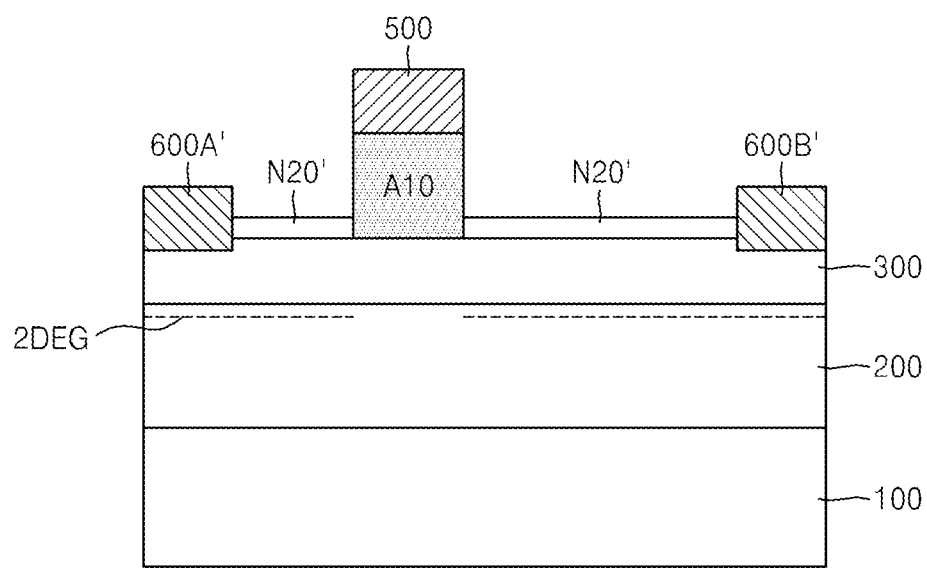

FIGS. 13A through 13C are cross-sectional views illustrating a method of manufacturing an HEMT, according to another example embodiment.

Referring to FIG. 13A, the structure as shown in FIG. 12E may be formed by using the method illustrated in FIGS. 12A through 12E.

Referring to FIG. 13B, the non-activated region N20 at the opposite sides of the gate electrode 500 may be etched to a partial thickness. The non-activated region remaining at the opposite sides of the gate electrode 500 is denoted by a reference numeral N20'. Since the remaining non-activated region N20' is not an effective p-doped region, the remaining non-activated region N20' may not affect the characteristics of the 2DEG.

Referring to FIG. 13C, a source electrode 600A' and a drain electrode 600B' may be formed. The source and drain electrodes 600A' and 600B' may be formed in the similar way to that of forming the source and drain electrodes 600A and 600B in FIG. 12F.

FIGS. 14A through 14E are cross-sectional views illustrating a method of manufacturing the HEMT, according to another example embodiment. The present example embodiment includes a process of forming a plurality of doped regions, doping concentrations of which are gradually changed in a lateral direction (horizontal direction) by using a plurality of masks.

Figure 14A:
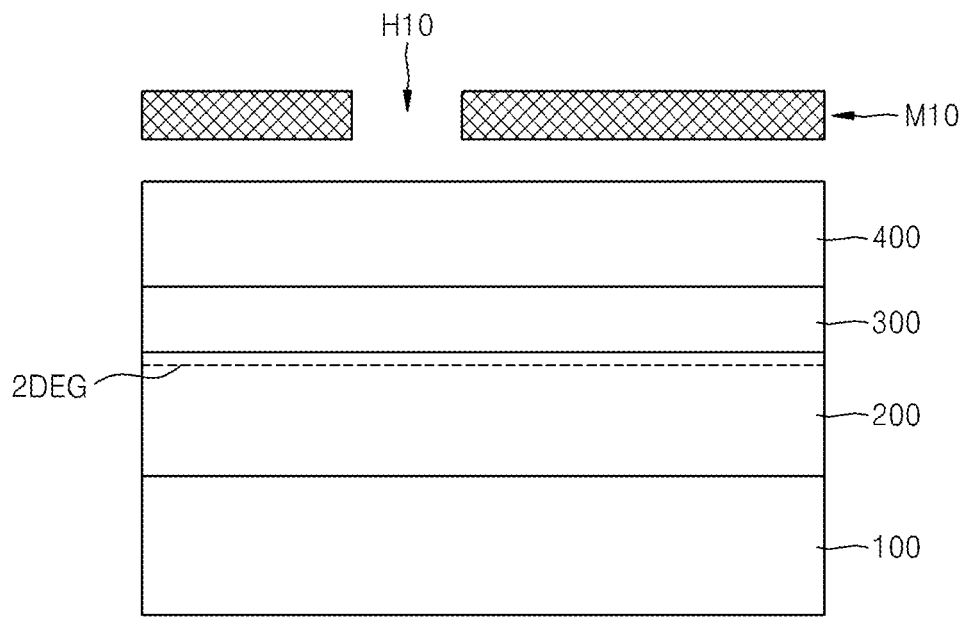
FIGS. 14A through 14E are cross-sectional views illustrating a method of manufacturing an HEMT, according to another example embodiment.

Referring to FIG. 14A, the channel layer 200, the channel supply layer 300, and the impurity containing layer 400 may be formed on the substrate 100 in a similar way to that of FIGS. 12A through 12C, and a first mask M10 may be located on the impurity containing layer 400. The first mask M10 may have a first opening H10 exposing a desired or alternatively predetermined region (first region) of the impurity containing layer 400.

Figure 14B:
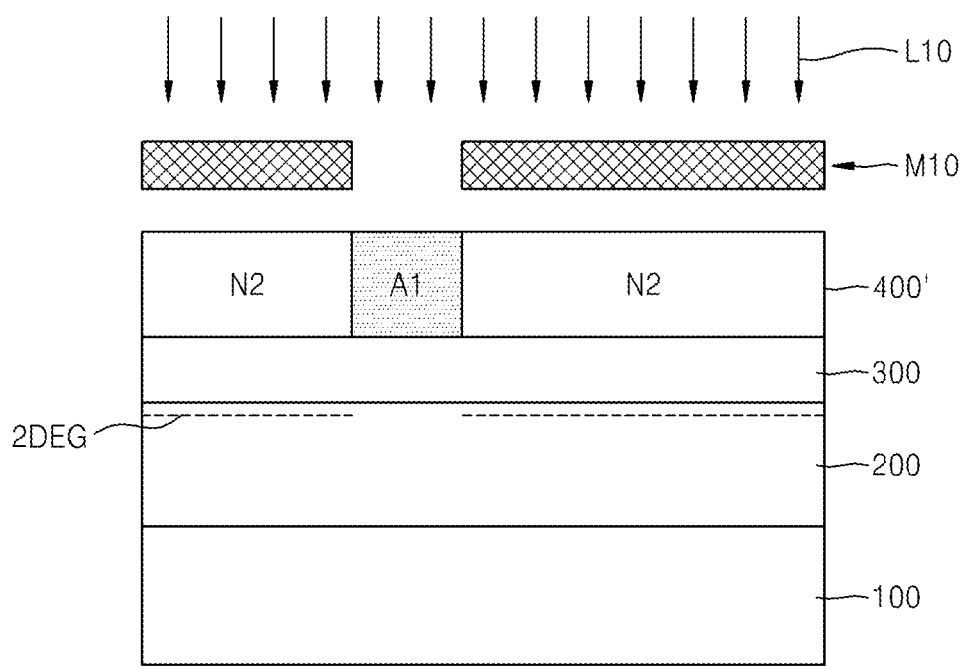

Referring to FIG. 14B, laser L10 may be irradiated onto the first region of the impurity containing layer 400 via the first opening H10 of the first mask M10 so as to form a first activated region A1 in the impurity containing layer 400. The first activated region A1 may have a first doping concentration. The impurity containing layer in which the first activated region A1 is formed is denoted by a reference numeral 400'. Non-activated regions N2 may be formed in the impurity containing layer 400' at opposite sides of the first activated region A1. The first activated region A1 may be an effective p-doped region, and the non-activated region N2 may not be an effective p-doped region.

Figure 14C:
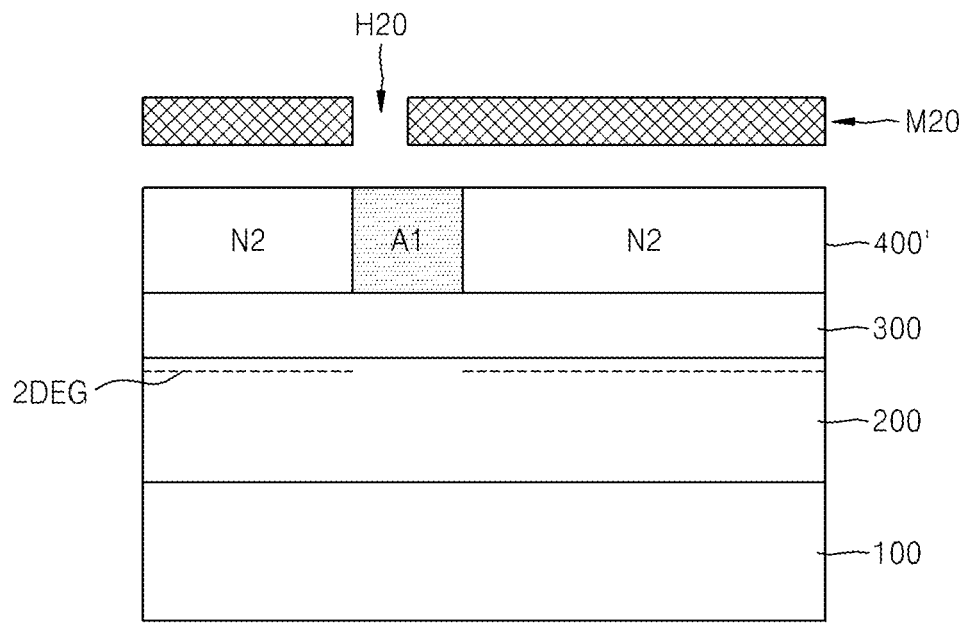

Referring to FIG. 14C, a second mask M20 may be located on the impurity containing layer 400'. The second mask M20 may include a second opening H20 exposing a portion of the first activated region A1. A left portion of the first activated region A1 may be exposed by the second opening H20.

Figure 14D:
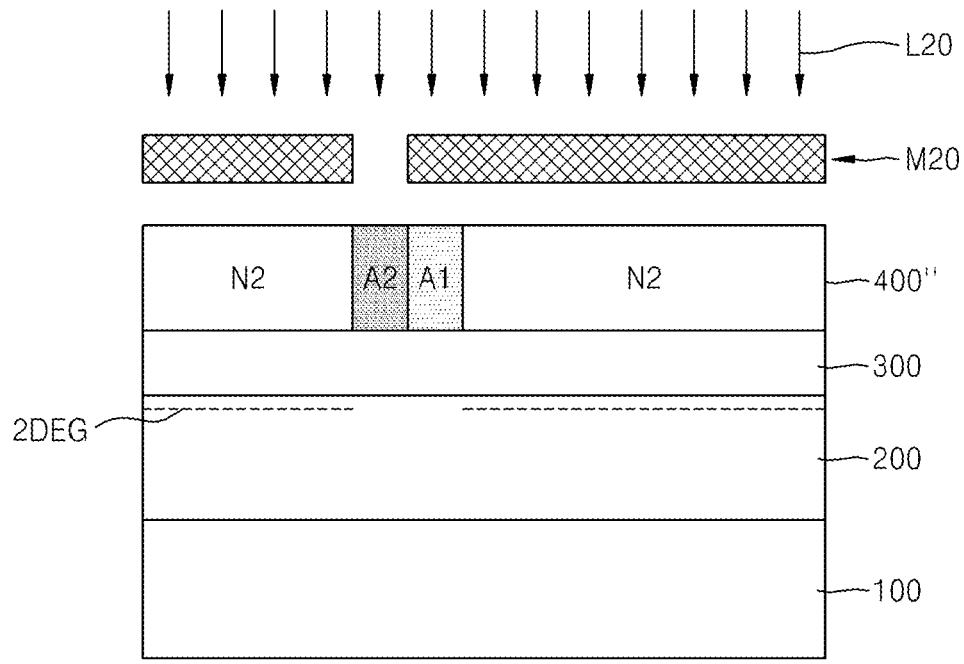

Referring to FIG. 14D, laser L20 may be irradiated onto the impurity containing layer 400' via the second opening H20 of the second mask M20. As a result, a second activated region A2 may be formed. The impurity containing layer in which the second activated region A2 is formed is denoted by a reference numeral 400". The second activated region A2 may be considered to be located at a left side of the first activated region A1. The second activated region A2 and the first activated region A1 may be arranged in a lateral direction (horizontal direction), and doping levels (doping concentrations) of the first and second activated regions A1 and A2 may be different from each other.

Figure 14E:
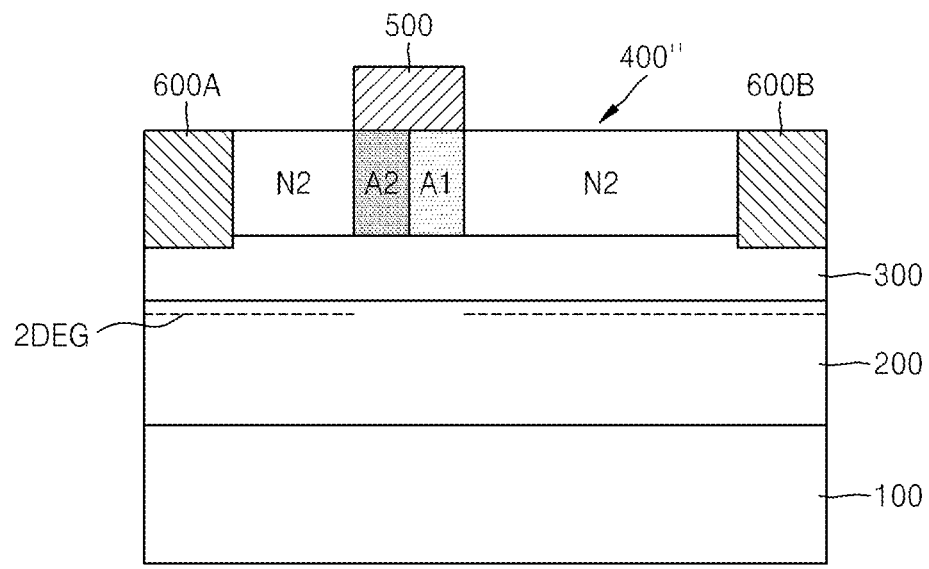

Referring to FIG. 14E, a gate electrode 500 may be formed on the first and second activated regions A1 and A2, and a source electrode 600A and a drain electrode 600B separate from the gate electrode 500 may be formed. The source and drain electrodes 600A and 600B may be configured to be electrically connected to at least one of the channel supply layer 300 and the channel layer 200.

Figure 15:
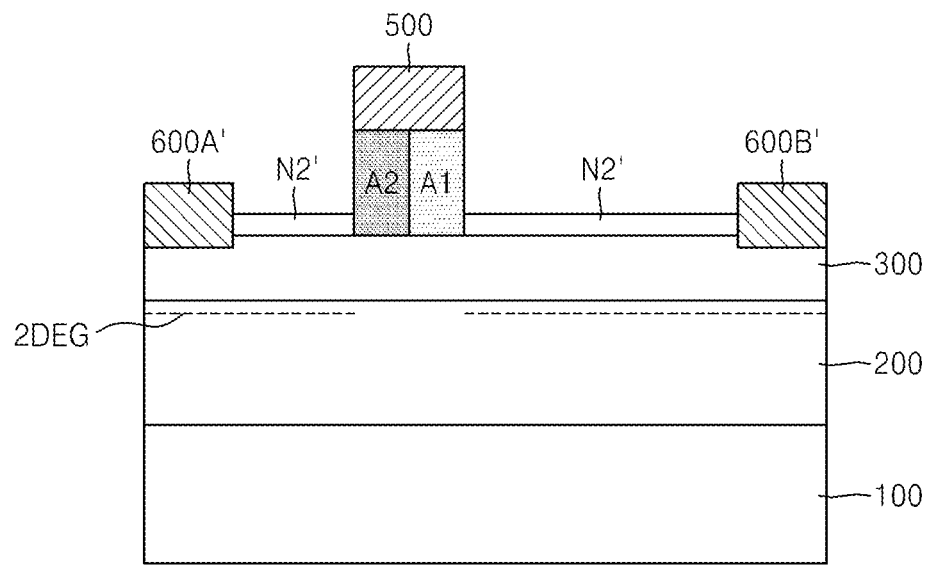
FIG. 15 is a cross-sectional view illustrating a method of manufacturing an HEMT, according to another example embodiment.

According to another example embodiment, as shown in FIG. 15, after forming the gate electrode 500, the non-activated region N2 at the opposite sides of the gate electrode 500 is etched to a desired or alternatively predetermined depth, and a source electrode 600A' and a drain electrode 600B' may be formed. In FIG. 15, N2' denotes remaining non-activated region after the etching process.

In FIGS. 14A through 14E, a plurality of activated regions (doped regions) A1 and A2, the doping levels (doping concentrations) of which are changed in the horizontal direction, are formed by using the plurality of masks M10 and M20; however, example embodiments are not limited thereto. For example, the plurality of activated regions (doped regions) having different doping levels (doping concentrations) may be formed by changing the activation energy (that is, laser energy, laser irradiation time, and the like) while moving one mask. Also, the gate electrode 500 may have a width that is less than that of the activated region (A1+A2). That is, the activated region (A1+A2) may be formed to have a greater width than that of the gate electrode 500. Otherwise, the example embodiments may be modified variously. The HEMTs having various structures illustrated with reference to FIGS. 3 through 11 may be manufactured according to example embodiments. Also, a source-gate bridge structure may be formed in the impurity containing layer 400.

If an HEMT including a plurality of doped regions (activated regions), the doping levels of which are changed in a horizontal direction (that is, lateral direction), under the gate electrode is manufactured, the electric field may be dispersed, the withstand voltage characteristic may be improved, and leakage current via the gate may be reduced or alternatively restrained as described above. Also, the HEMT, characteristics of which are controlled according to a purpose thereof, may be more easily manufactured. According to the comparative examples shown in FIG. 17A through 17C, the impurity containing layer is activated by using the thermal annealing process, a selective (local) activation process may not be possible. However, according to example embodiments, an optical energy (for example, laser) is irradiated onto the impurity containing layer via an opening of the mask, and thus, a partial region in the impurity containing layer may be selectively activated, and accordingly, the HEMT of various structures having excellent performances may be easily manufactured.

Figure 16A:
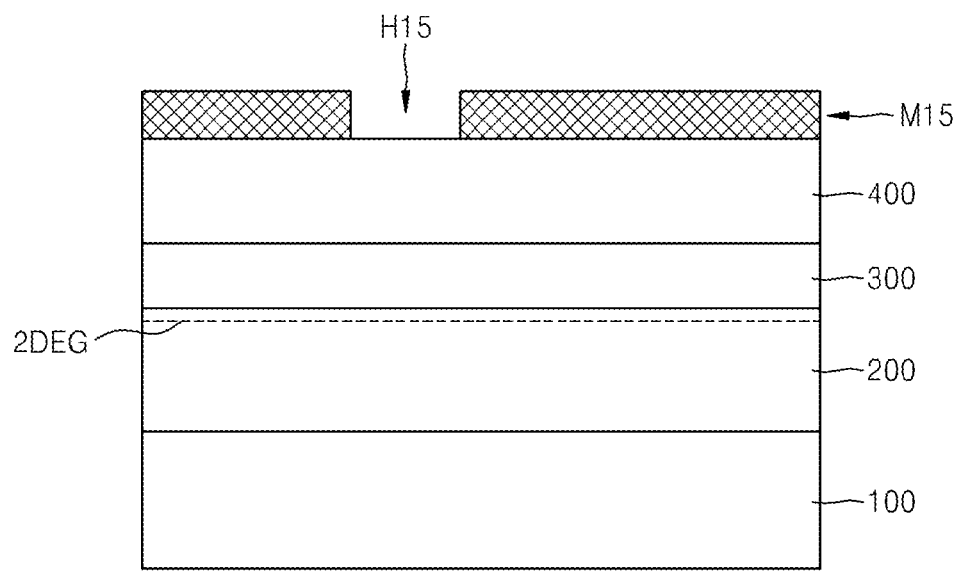
FIGS. 16A and 16B are cross-sectional views illustrating a method of manufacturing an HEMT, according to another example embodiment.
Figure 16B:
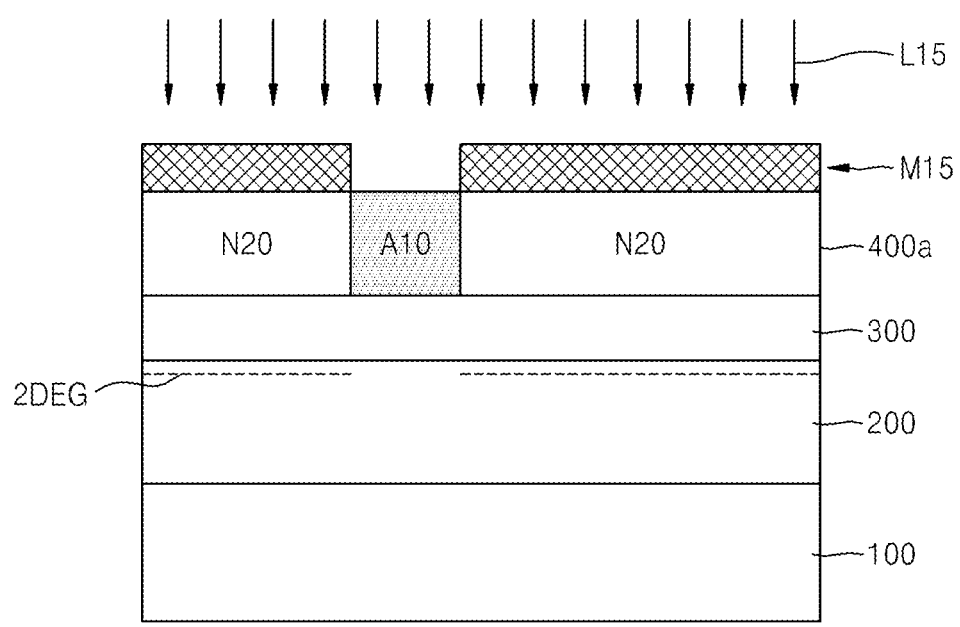

Additionally, according to example embodiments, the selective activation process may be performed by using the mask M1, M10, or M20 that is separated from the impurity containing layer 400; however, the activation process may be performed by using a mask layer contacting the impurity containing layer 400 as shown in FIGS. 16A and 16B.

Referring to FIG. 16A, a mask layer M15 may be formed on the impurity containing layer 400 while contacting the impurity containing layer 400. The mask layer M15 may be formed of a desired or alternatively predetermined material, for example, metal. The mask layer M15 may have an opening H15 exposing a partial region (hereinafter, first region) of the impurity containing layer 400.

Referring to FIG. 16B, laser L15 may be irradiated onto the first region of the impurity containing layer 400 via the opening H15 to form an activated region A10. The impurity containing layer in which the activated region A10 is formed is denoted by a reference numeral 400a. The activated region A10 may be substantially the same as or similar to the activated region A10 shown in FIG. 12D. The non-activated region N20 may be located at opposite sides of the activated region A10 in the impurity containing layer 400a.

After that, although not shown in the drawings, the mask layer M15 may be removed, and post processes that are the same as (or similar to) the processes shown in FIGS. 12E and 12F may be performed to manufacture an HEMT.

The HEMTs according to example embodiments may be applied to various electronic devices, for example, a power device. Configuration of a conventional power device including an HEMT is well known in the art, and thus, detailed descriptions thereof are not provided here. The HEMTs according to example embodiments may be applied to various other electronic devices, as well as the power device, for many purposes.

It should be understood that the exemplary embodiments described therein should be considered in a descriptive sense only and not for purposes of limitation. Descriptions of features or examples within each embodiment should typically be considered as available for other similar features or examples in other embodiments. For example, one of ordinary skill in the art would have appreciated that the HEMT structures shown in FIGS. 1 through 11 may be modified variously. In more detail, the HEMT may further include a field plate extending from the gate electrode. Also, other materials, besides the GaN-based material, may be used to form the channel layer and the channel supply layer. Also, relationship between the locations of the channel layer and the channel supply layer may be exchanged. In addition, the manufacturing methods described with reference to FIGS. 12A through 16B may be modified variously. Additionally, one of ordinary skill in the art would appreciate that the idea of the example embodiments may be applied to other semiconductor devices, as well as the HEMT. While some example embodiments have been particularly shown and described, it will be understood by one of ordinary skill in the art that variations in form and detail may be made therein without departing from the spirit and scope of the claims.

What is claimed is:
1. A high electron mobility transistor (HEMT) comprising:
a first semiconductor layer;
a second semiconductor layer on the first semiconductor layer, and inducing a two-dimensional electron gas (2DEG) in the first semiconductor layer;

an impurity containing layer on the second semiconductor layer and containing p-type impurities;
a gate on the impurity containing layer; and
a source and a drain separate from the gate and electrically connected to at least one of the first semiconductor layer and the second semiconductor layer,
wherein the impurity containing layer comprises a first region corresponding to the gate and a second region at opposite sides of the first region,
wherein the first region comprises an impurity region configured to be activated to generate holes and the second region comprises a non-activated impurity region, and
wherein a depletion region is formed by the activated impurity region in a region of the 2DEG corresponding to the activated impurity region, and
wherein a partial thickness of the non-activated impurity region is removed so that the non-activated impurity region has a thickness smaller than a thickness of the activated impurity region.

2. The HEMT of claim 1, wherein a hydrogen content of the first region of the impurity containing layer is lower than a hydrogen content of the second region.

3. The HEMT of claim 1, wherein a work function of the first region of the impurity containing layer is greater than a work function of the second region.

4. The HEMT of claim 1, wherein an electric resistance of the second region of the impurity containing layer is higher than an electric resistance of the first region.

5. The HEMT of claim 1, wherein the first semiconductor layer comprises a gallium nitride-based material, and
wherein the second semiconductor layer has a single-layered or multi-layered structure including at least one material selected from nitrides containing at least one selected from the group consisting of aluminum (Al), gallium (Ga), indium (In), and boron (B).

6. The HEMT of claim 1, wherein the impurity containing layer comprises a group III-V based nitride, and
wherein the p-type impurities comprise magnesium (Mg).

7. The HEMT of claim 1, wherein the first region of the impurity containing layer has a constant doping concentration.

8. The HEMT of claim 1, wherein the first region of the impurity containing layer has a doping level that is changed laterally.

9. The HEMT of claim 1, wherein the first region of the impurity containing layer has a width that is same as or greater than a width of the gate.

10. A power device comprising the HEMT according to claim 1.

11. A high electron mobility transistor (HEMT) comprising:
a first semiconductor layer;
a second semiconductor layer on the first semiconductor layer, and inducing a two-dimensional electron gas (2DEG) in the first semiconductor layer;
a gate corresponding to a portion of the second semiconductor layer;
a source and a drain separate from the gate, and electrically connected to at least one of the first semiconductor layer and the second semiconductor layer; and
a depletion forming element between the gate and the second semiconductor layer and configured to form a depletion region in the 2DEG,
wherein the depletion forming element comprises a plurality of regions, and properties of the plurality of regions vary in a horizontal direction, and
wherein adjacent two regions of the plurality of regions directly contact each other, and at least a portion of the adjacent two regions is disposed between the gate and the second semiconductor layer.

12. The HEMT of claim 11, wherein the depletion forming element comprises a group III-V based nitride and p-type impurities doped in the group III-V based nitride.

13. The HEMT of claim 11, wherein the plurality of regions of the depletion forming element have different doping levels.

14. The HEMT of claim 11, further comprising a material layer including non-activated impurities on the second semiconductor layer at opposite sides of the depletion forming element.

15. A method of manufacturing a high electron mobility transistor (HEMT), the method comprising:
forming a first semiconductor layer;
forming a second semiconductor layer on the first semiconductor layer, wherein the second semiconductor layer induces a two-dimensional electron gas (2DEG) in the first semiconductor layer;
forming an impurity containing layer including p-type impurities on the second semiconductor layer;
forming an activated region by selectively activating a first region of the impurity containing layer, wherein a region of the 2DEG is depleted by the activated region;
forming a gate on the activated region in a state where a non-activated region remains in the impurity containing layer at opposite sides of the activated region;
forming a source and a drain separated from the gate and electrically connected to at least one of the first semiconductor layer and the second semiconductor layer,
wherein the method further comprises removing a partial thickness of the non-activated region at the opposite sides of the activated region, after forming the activated region.

16. The method of claim 15, wherein the selectively activating the first region of the impurity containing layer comprises:
locating a mask having an opening exposing the first region on the impurity containing layer; and
irradiating a laser onto the first region via the opening of the mask.

17. The method of claim 15, wherein the first semiconductor layer comprises a gallium nitride-based material, and
wherein the second semiconductor layer has a single-layered or multi-layered structure including at least one material selected from nitrides containing at least one selected from the group consisting of aluminum (Al), gallium (Ga), indium (In), and boron (B).

18. The method of claim 15, wherein the impurity containing layer comprises a group III-V based nitride, and wherein the p-type impurities comprise magnesium (Mg).

19. The method of claim 15, wherein the activated region comprises a plurality of regions having different doping levels, and the plurality of regions having different doping levels are arranged in a horizontal direction.

20. The method of claim 19, wherein the plurality of regions having the different doping levels are formed by using a plurality of masks.

21. The HEMT of claim 11, wherein the gate overlaps the plurality of regions of the depletion forming element.

* * * * *